US011832039B2

(12) United States Patent
Nelson et al.

(10) Patent No.: US 11,832,039 B2
(45) Date of Patent: Nov. 28, 2023

(54) TUNING CALIBRATION TECHNOLOGY FOR SYSTEMS AND METHODS FOR ACOUSTICALLY CORRECTING SOUND LOSS THROUGH FABRIC

(71) Applicant: The Lovesac Company, Stamford, CT (US)

(72) Inventors: Shawn Nelson, Washington, UT (US); David Underwood, Hurricane, UT (US); Brian Kuchler, Hurricane, UT (US); Clint Gibson, St. George, UT (US)

(73) Assignee: The Lovesac Company, Stamford, CT (US)

( * ) Notice: Subject to any disclaimer, the term of this patent is extended or adjusted under 35 U.S.C. 154(b) by 0 days.

(21) Appl. No.: 17/348,088

(22) Filed: Jun. 15, 2021

(65) Prior Publication Data

US 2022/0337928 A1 Oct. 20, 2022

Related U.S. Application Data

(60) Provisional application No. 63/173,899, filed on Apr. 12, 2021.

(51) Int. Cl.
*H03G 5/00* (2006.01)
*H04R 1/02* (2006.01)
(Continued)

(52) U.S. Cl.
CPC ............. *H04R 1/025* (2013.01); *A47C 7/727* (2018.08); *A47C 13/005* (2013.01); *H04R 3/04* (2013.01);
(Continued)

(58) Field of Classification Search
CPC .......... H04R 1/025; H04R 3/04; H04R 5/023; H04R 2201/028; H04R 2420/07; A47C 7/727; A47C 13/005
(Continued)

(56) References Cited

U.S. PATENT DOCUMENTS

| | | | |
|---|---|---|---|
| 988,059 | A | 3/1911 | Allen |
| 2,625,983 | A | 1/1953 | Raymond et al. |

(Continued)

FOREIGN PATENT DOCUMENTS

| | | | |
|---|---|---|---|
| CN | 2236262 | Y | 10/1996 |
| CN | 101005741 | A | 7/2007 |

(Continued)

OTHER PUBLICATIONS

"The Wireless Speaker and Audio (WISA(Registered)) Association," retrieved Nov. 7, 2016 at www.wisaassocation.org, 2 pages.

(Continued)

*Primary Examiner* — Ammar T Hamid
(74) *Attorney, Agent, or Firm* — Workman Nydegger

(57) ABSTRACT

An audio-enhanced furniture system comprises: a furniture assembly; an upholstery fabric at least partially covering the furniture assembly; and a speaker system positioned within the furniture assembly, the speaker system including a speaker covered by the upholstery fabric. The speaker is configured to be tuned to compensate for sound being emitted from the speaker through the upholstery fabric. A method of tuning a speaker to compensate for sound being emitted through upholstery fabric comprises: selecting a baseline equalization, configuring the speaker to emit sound at an actual equalization approximate to the baseline equalization; covering the speaker with an upholstery fabric; measuring a resultant equalization as the speaker emits sound through the upholstery fabric; calculating a differen-
(Continued)

tial equalization; and reconfiguring the audio system to emit sound from the speaker through the upholstery fabric according to the baseline equalization by adjusting the actual equalization by the differential equalization.

44 Claims, 17 Drawing Sheets

(51) Int. Cl.
*A47C 7/72* (2006.01)
*A47C 13/00* (2006.01)
*H04R 3/04* (2006.01)
*H04R 5/02* (2006.01)

(52) U.S. Cl.
CPC ....... *H04R 5/023* (2013.01); *H04R 2201/028* (2013.01); *H04R 2420/07* (2013.01)

(58) Field of Classification Search
USPC .......................................... 381/103, 104, 98
See application file for complete search history.

(56) References Cited

U.S. PATENT DOCUMENTS 2,653,648 A 9/1953 Marshall
3,113,633 A 12/1963 Eberhardt et al.
3,870,297 A 3/1975 Elder
3,880,152 A 4/1975 Nohmura
3,893,731 A 7/1975 Maggs
4,120,017 A 10/1978 Sickles
4,124,249 A 11/1978 Abbeloos
4,321,717 A 3/1982 Serra
4,507,816 A 4/1985 Smith, Jr.
4,734,946 A 4/1988 Saputo
4,846,525 A 7/1989 Manning
5,106,153 A 4/1992 Durling
5,133,017 A 7/1992 Cain et al.
5,173,943 A 12/1992 Dzurko
5,362,296 A 11/1994 Wang et al.
5,367,727 A 11/1994 Dyer, Jr.
5,368,359 A 11/1994 Eakin
5,544,938 A 8/1996 Saul et al.
5,624,156 A 4/1997 Leal et al.
5,681,179 A 10/1997 Lane
5,683,139 A 11/1997 Golynsky et al.
5,735,573 A 4/1998 Vredevoogd
5,790,993 A 8/1998 Roma et al.
5,828,766 A 10/1998 Gallo
5,895,365 A 4/1999 Tomlinson
5,967,820 A 10/1999 Siegal et al.
5,995,634 A 11/1999 Zwolski
6,000,353 A 12/1999 De Leu
6,000,758 A 12/1999 Schaffner et al.
6,073,723 A 6/2000 Gallo
6,092,867 A 7/2000 Miller
6,322,146 B1 11/2001 Fisher, Jr.
6,683,965 B1 1/2004 Sapiejewski
6,814,709 B2 11/2004 Schwartz et al.
7,003,832 B2 2/2006 Wilson
7,090,297 B2 8/2006 Mohn et al.
7,172,196 B2 2/2007 Randall
7,213,885 B2 5/2007 White et al.
D547,087 S 7/2007 Natuzzi
7,312,393 B2 12/2007 McCarthy
7,419,220 B2 9/2008 White et al.
7,421,608 B2 9/2008 Schron
7,547,073 B2 6/2009 White et al.
7,553,288 B2 6/2009 Cohen
7,575,279 B2 8/2009 Robertson
7,631,937 B2 12/2009 Robertson
7,699,389 B2 4/2010 Robertson
7,735,912 B2 6/2010 Robertson
7,766,421 B2 8/2010 Lawson
7,871,280 B2 1/2011 Henriott
7,918,308 B2 4/2011 Cohen
7,963,612 B2 6/2011 Nelson
7,982,436 B2 7/2011 Randall
8,061,864 B2 11/2011 Metcalf et al.
8,074,581 B2 12/2011 Epstein et al.
8,132,856 B2 3/2012 Wilson et al.
8,146,229 B2 4/2012 Henriott et al.
8,228,026 B2 7/2012 Johnson et al.
8,421,407 B2 4/2013 Johnson
8,668,045 B2 3/2014 Cohen
8,783,778 B2 7/2014 Nelson et al.
8,920,191 B2 12/2014 Carpanzano
8,935,985 B2 1/2015 Hjelm
9,010,851 B2 4/2015 Lapointe
9,088,117 B2 7/2015 Rosenblum
9,095,209 B2 8/2015 Mirth et al.
9,119,000 B2 8/2015 Tracy
9,124,308 B2 9/2015 Metcalf
9,185,988 B1 11/2015 Sanchez
9,277,826 B2 3/2016 Nelson et al.
9,295,339 B2 3/2016 Hampton
9,529,431 B2 12/2016 Bleacher et al.
9,585,468 B2 3/2017 Udagawa et al.
9,734,815 B2 8/2017 Defranks et al.
9,788,092 B2 10/2017 Rawls-Meehan et al.
9,853,405 B2 12/2017 Suri
9,905,217 B2 2/2018 Hyde et al.
9,975,459 B2 5/2018 Takada et al.
9,984,686 B1 5/2018 Mutagi et al.
10,051,354 B2 8/2018 Linjama et al.
10,212,519 B2 2/2019 Nelson et al.
10,235,543 B2 3/2019 Pachler et al.
10,235,643 B2 3/2019 Sawka
10,236,643 B2 3/2019 Nelson et al.
D848,393 S 5/2019 Pennanen et al.
10,679,601 B2 6/2020 Linjama et al.
10,827,280 B2 11/2020 Linjama et al.
10,957,302 B2 3/2021 Linjama et al.
10,972,838 B2 4/2021 Nelson et al.
10,979,241 B2 4/2021 Nelson et al.
11,039,234 B2 6/2021 Linjama et al.
11,112,301 B2 9/2021 Lee et al.
11,159,026 B2 10/2021 Kim
11,172,301 B2 11/2021 Nelson
11,178,486 B2 11/2021 Nelson et al.
11,178,487 B2 11/2021 Nelson et al.
11,374,417 B2 6/2022 Bober et al.
11,381,091 B2 7/2022 Fang et al.
11,435,534 B2 9/2022 Hill et al.
11,444,485 B2 9/2022 Partovi
11,469,615 B2 10/2022 Bober et al.
11,647,840 B2 5/2023 Nelson et al.
11,689,856 B2 6/2023 Nelson et al.
2001/0020810 A1 9/2001 Kennedy
2002/0063454 A1 5/2002 Illulian
2003/0025366 A1 2/2003 Barreiro
2003/0102657 A1 6/2003 Kuo
2003/0139693 A1 7/2003 Swift
2004/0026998 A1 2/2004 Henriott et al.
2004/0061943 A1 4/2004 Bosch et al.
2004/0095000 A1 5/2004 Durling
2005/0007067 A1 1/2005 Baarman et al.
2005/0008147 A1 1/2005 Lee
2005/0053252 A1 3/2005 Cohen
2005/0096098 A1 5/2005 Woods
2005/0185801 A1 8/2005 McCarty et al.
2005/0264044 A1 12/2005 Lee
2006/0036201 A1 2/2006 Cohen
2006/0076813 A1 4/2006 Mohn et al.
2006/0238087 A1 10/2006 Holt
2006/0279124 A1 12/2006 White et al.
2007/0001494 A1 1/2007 Hoover
2007/0164178 A1 7/2007 Beilstein et al.
2008/0012404 A1 1/2008 Dewert
2008/0037794 A1 2/2008 Sugawara et al.
2008/0122241 A1 5/2008 Blackmore et al.
2008/0150329 A1 6/2008 Lawson
2008/0220646 A1 9/2008 Leddusire

(56) References Cited

U.S. PATENT DOCUMENTS

| | | | | |
|---|---|---|---|---|
| 2008/0262657 | A1 | 10/2008 | Howell et al. | |
| 2009/0001775 | A1 | 1/2009 | Smith | |
| 2009/0032660 | A1 | 2/2009 | Wadsworth et al. | |
| 2009/0072782 | A1 | 3/2009 | Randall | |
| 2009/0096255 | A1 | 4/2009 | Robertson | |
| 2009/0212638 | A1 | 8/2009 | Johnson | |
| 2009/0212639 | A1 | 8/2009 | Johnson | |
| 2009/0212737 | A1 | 8/2009 | Johnson et al. | |
| 2009/0250982 | A1 | 10/2009 | Cohen | |
| 2010/0055928 | A1 | 3/2010 | Randall | |
| 2010/0178797 | A1 | 7/2010 | Byrne | |
| 2010/0290215 | A1 | 11/2010 | Metcalf et al. | |
| 2010/0320819 | A1 | 12/2010 | Cohen et al. | |
| 2011/0012403 | A1 | 1/2011 | Wilson et al. | |
| 2011/0025915 | A1 | 2/2011 | Daban | |
| 2011/0109163 | A1 | 5/2011 | Bennett | |
| 2011/0109211 | A1 | 5/2011 | Kirkeby et al. | |
| 2011/0110075 | A1 | 5/2011 | Smith | |
| 2011/0298340 | A1 | 12/2011 | Nelson et al. | |
| 2012/0026724 | A1 | 2/2012 | Metcalf et al. | |
| 2012/0051579 | A1 | 3/2012 | Cohen | |
| 2012/0200129 | A1 | 8/2012 | Wilson, Jr. | |
| 2012/0286557 | A1 | 11/2012 | Hoffman et al. | |
| 2012/0316884 | A1 | 12/2012 | Rozaieski et al. | |
| 2013/0002001 | A1 | 1/2013 | Allen et al. | |
| 2013/0066636 | A1 | 3/2013 | Singhal | |
| 2013/0129105 | A1 | 5/2013 | Hua | |
| 2013/0137524 | A1 | 5/2013 | Scott | |
| 2013/0177198 | A1 | 7/2013 | Hogue et al. | |
| 2013/0199421 | A1 | 8/2013 | Hjelm | |
| 2013/0207478 | A1 | 8/2013 | Metcalf et al. | |
| 2013/0234481 | A1 | 9/2013 | Johnson | |
| 2013/0249257 | A1 | 9/2013 | Suhre et al. | |
| 2013/0333940 | A1 | 12/2013 | Stencil | |
| 2014/0010387 | A1 | 1/2014 | Cohen | |
| 2014/0197666 | A1 | 7/2014 | Koch | |
| 2014/0272266 | A1 | 9/2014 | Svilar | |
| 2014/0285140 | A1 | 9/2014 | Jung | |
| 2014/0368476 | A1 | 12/2014 | Rauch et al. | |
| 2015/0061258 | A1 | 3/2015 | Flores et al. | |
| 2015/0069965 | A1 | 3/2015 | Verschueren | |
| 2015/0076881 | A1 | 3/2015 | Lapointe | |
| 2015/0076891 | A1 | 3/2015 | Lapointe et al. | |
| 2015/0230622 | A1 | 8/2015 | Orbelian | |
| 2015/0255914 | A1 | 9/2015 | Kong et al. | |
| 2015/0300627 | A1 | 10/2015 | Wang et al. | |
| 2015/0334482 | A1 | 11/2015 | Rawls-Meehan et al. | |
| 2016/0118035 | A1 | 4/2016 | Hyde et al. | |
| 2016/0126916 | A1* | 5/2016 | Kappus .................... | H03G 3/00 381/103 |
| 2016/0136529 | A1 | 5/2016 | Weston et al. | |
| 2016/0174715 | A1 | 6/2016 | Nelson et al. | |
| 2016/0257227 | A1 | 9/2016 | Takada et al. | |
| 2016/0286291 | A1 | 9/2016 | Linjama et al. | |
| 2016/0379631 | A1 | 12/2016 | Wang et al. | |
| 2017/0143122 | A1 | 5/2017 | Nelson et al. | |
| 2017/0149181 | A1 | 5/2017 | Nelson et al. | |
| 2017/0150264 | A1 | 5/2017 | Nelson et al. | |
| 2017/0214197 | A1 | 7/2017 | Suri | |
| 2017/0221340 | A1 | 8/2017 | Rhoads et al. | |
| 2017/0295941 | A1 | 10/2017 | King et al. | |
| 2017/0317458 | A1 | 11/2017 | Byrne et al. | |
| 2018/0000244 | A1 | 1/2018 | Nelson et al. | |
| 2018/0041354 | A1 | 2/2018 | Nelson et al. | |
| 2018/0158192 | A1 | 6/2018 | Rocque et al. | |
| 2018/0191178 | A1 | 7/2018 | Byrne et al. | |
| 2018/0253947 | A1* | 9/2018 | Muhsin .................... | H04R 3/12 |
| 2019/0222935 | A1 | 7/2019 | Nelson et al. | |
| 2019/0266993 | A1 | 8/2019 | Linjama et al. | |
| 2020/0100030 | A1* | 3/2020 | Nelson ................... | H04R 5/023 |
| 2020/0100031 | A1 | 3/2020 | Nelson et al. | |
| 2020/0221227 | A1 | 7/2020 | Nelson et al. | |
| 2021/0002170 | A1 | 1/2021 | Chien et al. | |
| 2021/0112341 | A1 | 4/2021 | Nelson et al. | |
| 2021/0352422 | A1* | 11/2021 | Lin ........................ | H04R 31/00 |
| 2022/0060829 | A1 | 2/2022 | Nelson et al. | |
| 2022/0078555 | A1 | 3/2022 | Nelson et al. | |
| 2022/0095060 | A1* | 3/2022 | Yang .................... | A61B 5/7475 |
| 2022/0115907 | A1 | 4/2022 | Bober et al. | |
| 2022/0400868 | A1 | 12/2022 | Nelson et al. | |
| 2022/0408925 | A1 | 12/2022 | Rafieha | |
| 2023/0111916 | A1 | 4/2023 | Nelson et al. | |
| 2023/0209262 | A1 | 6/2023 | Nelson et al. | |
| 2023/0209263 | A1 | 6/2023 | Nelson et al. | |
| 2023/0217170 | A1 | 7/2023 | Nelson et al. | |

FOREIGN PATENT DOCUMENTS

| | | | |
|---|---|---|---|
| CN | 201135239 | Y | 10/2008 |
| CN | 201178847 | Y | 1/2009 |
| CN | 201282826 | Y | 8/2009 |
| CN | 201341645 | Y | 11/2009 |
| CN | 201452358 | U | 5/2010 |
| CN | 201518894 | U | 7/2010 |
| CN | 101909490 | A | 12/2010 |
| CN | 202211357 | U | 5/2012 |
| CN | 202553058 | U | 11/2012 |
| CN | 202817641 | U | 3/2013 |
| CN | 202907151 | U | 4/2013 |
| CN | 202981088 | U | 6/2013 |
| CN | 203563950 | U | 4/2014 |
| CN | 203609079 | U | 5/2014 |
| DE | 102012211865 | A1 | 5/2013 |
| EP | 3244633 | A1 | 5/2016 |
| EP | 3244628 | A1 | 11/2017 |
| EP | 3097703 | B1 | 10/2018 |
| FI | 20196020 | A1 | 5/2021 |
| GB | 2300329 | A | 10/1996 |
| JP | 47-004753 | Y1 | 2/1972 |
| JP | 56-087863 | A | 7/1981 |
| JP | 59-067079 | A | 4/1984 |
| JP | 59-107523 | A | 6/1984 |
| JP | 06-079086 | A | 3/1994 |
| JP | 08-063174 | A | 3/1996 |
| JP | 3047023 | U | 3/1998 |
| JP | 2001-285976 | A | 10/2001 |
| JP | 2004-097273 | A | 4/2004 |
| JP | 2007-003994 | A | 1/2007 |
| JP | 2008-513138 | A | 5/2008 |
| JP | 2008-545504 | A | 12/2008 |
| JP | 2013-094405 | A | 5/2013 |
| JP | 2014-230026 | A | 12/2014 |
| JP | 2015-126460 | A | 7/2015 |
| WO | 99/63786 | A1 | 12/1999 |
| WO | 2006/135509 | A2 | 12/2006 |
| WO | 2009/113319 | A1 | 9/2009 |
| WO | 2012/093398 | A2 | 7/2012 |
| WO | 2014/072975 | A1 | 5/2014 |
| WO | 2015/118217 | A1 | 8/2015 |
| WO | 2016/044884 | A1 | 3/2016 |
| WO | 2017/087266 | A1 | 5/2017 |
| WO | 2017/087268 | A1 | 5/2017 |
| WO | 2017/194785 | A1 | 11/2017 |
| WO | 2018/134142 | A1 | 7/2018 |
| WO | 2018/189422 | A1 | 10/2018 |
| WO | 2021/105554 | A1 | 6/2021 |
| WO | 2021/141783 | A1 | 7/2021 |
| WO | 2022/262950 | A1 | 12/2022 |

OTHER PUBLICATIONS

"WISA Wireless Speaker & Audio," retrieved on Nov. 7, 2016 at www.wisaassociation.org, 3 pages.

Bose Corporation, Wikipedia, http://en.wikipedia.org/wiki/Bose_Corporation, Apr. 25, 2012.

Corrected Notice of Allowance received for U.S. Appl. No. 15/786,922, dated Sep. 23, 2020.

Corrected Notice of Allowance received for U.S. Appl. No. 15/786,922, dated Sep. 28, 2020.

Curry, M. "Its Speakers Sound Good Even in Terrible Listening Environments, i.e. Your Apartment;" Core77; Article [online]. Sep. 29, 2015 [retrieved Jan. 30, 2017]. Retrieved from the Internet:

(56) References Cited

OTHER PUBLICATIONS

<URL: http://www.core77.com/posts/41080/Sonos-Debuts-Software-That-Makes-Its-Speakers-Sound-Good-Even-in-Terrible-Listening-Environments-ie-Your-Apartment; p. 2, paragraph 2 to p. 4, paragraph 1.
Equalization (audio) Wikipedia, web.archive.org archived pages, https://web.archive.org/web/20210325042554/https://en.wikipedia.org/wiki/Equalization_(audio) dated Mar. 25, 2021, last updated Mar. 20, 2021 (11 pages).
Equalization (audio); Wikipedia, https://en.wikipedia.org/wiki/Equalization_(audio), printed Jul. 13, 2021 (11 pages).
Equalization—What's the difference of frequency sets for 10 band equalizers?—Sound Design Stock Exchange; sound.stackechange.com question/answer website pages; dated Jan. 22, 2015 (2 pages).
Final Office Action received for U.S. Appl. No. 13/869,600, dated Sep. 14, 2016.
Final Office Action received for U.S. Appl. No. 15/270,339, dated Mar. 12, 2018.
Final Office Action received for U.S. Appl. No. 15/786,922, dated May 22, 2019.
Final Office Action received for U.S. Appl. No. 16/273,773, dated Feb. 12, 2020.
Final Office Action received for U.S. Appl. No. 16/273,773, dated Oct. 13, 2020.
Final Rejection dated May 3, 2021 for U.S. Appl. No. 16/696,696.
Final Rejection dated May 24, 2021 for U.S. Appl. No. 16/738,916.
Final Rejection received for U.S. Appl. No. 15/348,068, dated Apr. 2, 2018.
Issue Notification received for U.S. Appl. No. 15/270,339, dated Feb. 27, 2019.
Issue Notification received for U.S. Appl. No. 15/348,068, dated Jan. 30, 2019.
Issue Notification received for U.S. Appl. No. 15/786,922, dated Aug. 5, 2020.
Leviton, "2-Gang White Duplex Outlet/Quick Port Plate Recessed Device," retrieved Nov. 17, 2017 at homedepot.com, (2 pages).
Leviton, "Product Bulletin for Recessed Devices Cal. Nos. 689 and 690," Copyright 2008, published and available, on information and belief, at least as early as 2008 (2 pages).
Non-Final Office Action received for U.S. Appl. No. 16/273,773, dated Jun. 16, 2020, 18 pages.
Non-Final Rejection dated Apr. 19, 2021 for U.S. Appl. No. 16/273,773.
Non-Final Rejection dated Jan. 28, 2021 for U.S. Appl. No. 16/738,916.
Non-Final Rejection received for U.S. Appl. No. 16/696,696, dated Jan. 14, 2021.
Notice of Allowance and Fees Due (PTOL-85) dated Jul. 27, 2021 for U.S. Appl. No. 16/273,773.
Notice of Allowance received for U.S. Appl. No. 15/270,339, dated Jan. 24, 2019.
Notice of Allowance received for U.S. Appl. No. 15/348,068, dated Dec. 12, 2018.
Notice of Allowance received for U.S. Appl. No. 15/786,922, dated Jul. 10, 2020.
Notice of Allowance received for U.S. Appl. No. 15/786,922, dated Mar. 2, 2020.
Notice of Allowance received for U.S. Appl. No. 15/786,922, dated Sep. 15, 2020.
Notice of Allowance received for U.S. Appl. No. 16/696,712, dated Aug. 27, 2020.
Notice of Allowance received for U.S. Appl. No. 16/696,712, dated Dec. 30, 2020.
Office Action received for U.S. Appl. No. 13/869,600, dated Dec. 15, 2015.
Office Action received for U.S. Appl. No. 15/270,339, dated Aug. 6, 2018.
Office Action received for U.S. Appl. No. 15/270,339, dated Jun. 22, 2017.
Office Action received for U.S. Appl. No. 15/348,068, dated Nov. 1, 2017.
Office Action received for U.S. Appl. No. 15/348,068, dated Oct. 2, 2018.
Office Action received for U.S. Appl. No. 15/786,922, dated Nov. 28, 2018.
Office Action received for U.S. Appl. No. 15/786,922, dated Oct. 1, 2019.
Office Action received for U.S. Appl. No. 16/273,773, dated Oct. 25, 2019.
Restriction Requirement received for U.S. Appl. No. 15/348,068, dated Aug. 2, 2017.
The Wall Street Journal newspaper article entitled, "Wireless Charging Everywhere," dated Dec. 30, 2015.
U.S. Appl. No. 60/778,761, entitled Power Delivery Surface Power Supply Safety, filed Mar. 3, 2006 (59 pages).
Notice of Allowance and Fees Due (PTOL-85) dated Sep. 21, 2021 for U.S. Appl. No. 16/696,696.
Notice of Allowance and Fees Due (PTOL-85) dated Sep. 28, 2021 for U.S. Appl. No. 16/738,916.
Non-Final Office Action received for U.S. Appl. No. 17/128,575, dated Oct. 24, 2022, 32 pages.
Sobro Coffee Table with Built in Fridge, Speakers, Outlets, LED Light, and More—Black, 12 pages, www.amazon.com, Nov. 29, 2022.
Sobro Smart Side/Nightstand Table—with Cooling Drawer, Wireless Charging, Bluetooth Speakers, USB-C and 120V outlets, LED Light, Black/Black, 11 pages, www.amazon.com, Nov. 29, 2022.
Black Sobro Smart End Table with Built-In-Outlets, 7 pages, www.wayfair.com, Nov. 30, 2022.
Jason Cartwright, This connected bed has wireless charging, bluetooth and a subwoofer, 8 pages, Aug. 12, 2019, www.techau.com.au, Nov. 28, 2022.
Non-Final Rejection received for U.S. Appl. No. 17/349,363, dated Aug. 25, 2022.
Notice of Allowance received for U.S. Appl. No. 17/349,363, dated Jan. 5, 2023.
Notice of Allowance received for U.S. Appl. No. 17/349,363, dated Sep. 28, 2022.
Notice of Allowance received for U.S. Appl. No. 17/520,488, dated Feb. 24, 2023, 10 pages.
Restriction Requirement received for U.S. Appl. No. 17/349,363, dated Jun. 10, 2022.
Issue Notification issued for U.S. Appl. No. 17/128,575 dated Jun. 7, 2023.
Issue Notification issued for U.S. Appl. No. 17/349,363 dated Apr. 27, 2023.
Lovesac Stealthtech, Sactionals Sound + Charge System, Setup Guide, 48 pages, Publicly available at least as early as Feb. 2023.
Lovesac Stealthtech, sound by harman/kardon, Get Ready for a Fully Immersive Audio Experience, Welcome to Sactionals StealthTech Sound + Charge, Software Application Screen Prints, 41 pages, publicly available, on information and belief, at least as early as Nov. 2021, Printed Feb. 2023.
Non-Final Office Action received for U.S. Appl. No. 18/065,329, dated May 30, 2023, 7 pages.
Notice of Allowance and Fees Due (PTOL-85) dated Apr. 13, 2023 for U.S. Appl. No. 17/128,575, 3 page(s).
Notice of Allowance and Fees Due (PTOL-85) dated Feb. 13, 2023 for U.S. Appl. No. 17/128,575, 15 page(s).
Notice of Allowance Office Action received for U.S. Appl. No. 17/520,488, dated Mar. 17, 2023, 5 pages.
Office Action received for U.S. Appl. No. 17/520,488, dated Feb. 24, 2023.

* cited by examiner

| Target Frequency (Hz) | F1 | F2 | F3 | ... | Fn |
|---|---|---|---|---|---|
| Baseline EQ (dB) | V1 | V2 | V3 | ... | Vn |
| w/ Fabric (dB) | V1_fabric1 | V2_fabric1 | V3_fabric1 | ... | Vn_fabric1 |
| EQ Compensation | ÄV1 | ÄV2 | ÄV3 | ... | ÄVn |

*FIG. 7*

POLYESTER

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 94 | 92 | 89 | 87 | 89 | 90 | 87 | 84 |
| w/ Fabric (dB) | 72 | 83 | 94 | 92 | 88 | 84 | 83 | 82 | 78 | 76 |
| EQ Compensation (dB) | 0 | 0 | 0 | 0 | 1 | 3 | 6 | 8 | 9 | 8 |

*FIG. 8A*

CHENILLE

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 95 | 92 | 89 | 87 | 89 | 90 | 87 | 84 |
| w/ Fabric (dB) | 72 | 83 | 94 | 92 | 89 | 86 | 85 | 85 | 82 | 79 |
| EQ Compensation (dB) | 0 | 0 | 1 | 0 | 0 | 1 | 4 | 5 | 5 | 5 |

*FIG. 8B*

TWEED

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 95 | 92 | 89 | 87 | 89 | 90 | 87 | 84 |
| w/ Fabric (dB) | 70 | 82 | 94 | 92 | 89 | 87 | 89 | 89 | 85 | 81 |
| EQ Compensation (dB) | 2 | 1 | 1 | 0 | 0 | 0 | 0 | 1 | 2 | 3 |

*FIG. 8C*

LINEN

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 95 | 92 | 89 | 87 | 89 | 90 | 87 | 84 |
| w/ Fabric (dB) | 71 | 83 | 95 | 92 | 89 | 86 | 89 | 89 | 85 | 81 |
| EQ Compensation (dB) | 1 | 0 | 0 | 0 | 0 | 1 | 0 | 1 | 2 | 3 |

*FIG. 8D*

VELVET

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 95 | 92 | 89 | 87 | 89 | 90 | 87 | 84 |
| w/ Fabric (dB) | 70 | 82 | 93 | 92 | 89 | 87 | 88 | 88 | 82 | 79 |
| EQ Compensation (dB) | 2 | 1 | 2 | 0 | 0 | 0 | 1 | 2 | 5 | 5 |

*FIG. 8E*

LEATHER

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 95 | 92 | 89 | 87 | 89 | 90 | 87 | 84 |
| w/ Fabric (dB) | 72 | 83 | 92 | 92 | 89 | 85 | 82 | 79 | 72 | 68 |
| EQ Compensation (dB) | 0 | 0 | 3 | 0 | 0 | 2 | 7 | 11 | 15 | 16 |

*FIG. 8F*

POLYESTER LINEN

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 95 | 92 | 89 | 87 | 89 | 90 | 87 | 84 |
| w/ Fabric (dB) | 71 | 83 | 93 | 92 | 88 | 87 | 84 | 84 | 77 | 73 |
| EQ Compensation (dB) | 1 | 0 | 2 | 0 | 1 | 0 | 5 | 6 | 10 | 11 |

*FIG. 8G*

FAUX FUR

| Target Frequency (Hz) | 32 | 63 | 125 | 250 | 500 | 1K | 2K | 4K | 8K | 16K |
|---|---|---|---|---|---|---|---|---|---|---|
| Baseline EQ (dB) | 72 | 83 | 95 | 92 | 89 | 87 | 89 | 90 | 87 | 84 |
| w/ Fabric (dB) | 72 | 82 | 94 | 92 | 89 | 85 | 81 | 80 | 76 | 74 |
| EQ Compensation (dB) | 0 | 1 | 1 | 0 | 0 | 2 | 8 | 10 | 11 | 10 |

*FIG. 8H*

TUNING CALIBRATION TECHNOLOGY FOR SYSTEMS AND METHODS FOR ACOUSTICALLY CORRECTING SOUND LOSS THROUGH FABRIC

CROSS-REFERENCE TO RELATED APPLICATIONS

Under 35 U.S.C. 119(e), the present application claims priority to and the benefit of U.S. Patent Application Ser. No. 63/173,899 filed Apr. 12, 2021, entitled TUNING CALIBRATION TECHNOLOGY FOR SYSTEMS AND METHODS FOR ACOUSTICALLY CORRECTING SOUND LOSS THROUGH FABRIC, which is herein incorporated by reference in its entirety.

The present application incorporates by reference, in their entirety, U.S. patent application Ser. No. 16/696,696 filed Nov. 26, 2019, entitled MODULAR FURNITURE SPEAKER ASSEMBLY WITH RECONFIGURABLE TRANSVERSE MEMBERS; U.S. patent application Ser. No. 16/273,773 filed Feb. 12, 2019, entitled ELECTRONIC FURNITURE SYSTEMS WITH INTEGRATED INTERNAL SPEAKERS; U.S. patent application Ser. No. 15/348,068 (now U.S. Pat. No. 10,212,519), filed on Nov. 10, 2016, entitled ELECTRONIC FURNITURE SYSTEMS WITH INTEGRATED INTERNAL SPEAKERS; U.S. patent application Ser. No. 15/270,339 (now U.S. Pat. No. 10,236,643), filed on Sep. 20, 2016, entitled ELECTRICAL HUB FOR FURNITURE ASSEMBLIES; U.S. Provisional Patent Application Ser. No. 62/257,623, filed on Nov. 19, 2015, entitled FURNITURE WITH ELECTRONIC ASSEMBLIES; and U.S. Provisional Patent Application Ser. No. 62/417,091, filed on Nov. 3, 2016, entitled ELECTRONIC FURNITURE SYSTEMS WITH INTEGRATED INTERNAL SPEAKERS.

BACKGROUND

Technical Field

This disclosure generally relates to sound systems integrated within furniture.

Related Technology

Speaker systems are widely used for home, business, social accommodations, entertainment and for practical, commercial, and household uses. Unfortunately, speaker systems take up a great deal of space in a home, office, or business environment, and even if small, they are often unsightly. Moreover, wiring and cabling associated with such systems is also unsightly and cumbersome.

Furniture also tends to take up a great deal of space in a home, office or business environment. When sitting on furniture, it is often desirable to listen to music, watch TV, or watch a movie in a home theater environment, or employ one or more electronic components. Improved furniture is needed with improved electronic assembly systems that can be used in association with modern furniture assemblies or devices.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments of the present disclosure solve one or more of the foregoing or other problems in the art with systems, methods, and apparatuses for acoustically correcting sound loss through various types and compositions of fabric. In particular, systems, methods and apparatuses of the present disclosure can be implemented to improve the sound quality of a speaker system having at least one speaker integrated with a furniture component and covered with an upholstery fabric. Such upholstery fabrics are typically not at all acoustically transparent, but are rather configured to provide a combination of durability and aesthetics to a seating or other furniture surface.

In particular, one or more embodiments can include an audio-enhanced furniture system including a furniture assembly; an upholstery fabric at least partially covering the furniture assembly; and a speaker system positioned within the furniture assembly, the speaker system including a speaker covered by the upholstery fabric. The speaker is configured to be tuned to compensate for sound being emitted from the speaker through the upholstery fabric by adjusting the equalization of one or more target frequencies or frequency bands emitted by the speaker. Embodiments can also include a plurality of tuning profiles corresponding to a plurality of upholstery fabrics, wherein a user may select a tuning profile from the plurality of tuning profiles.

Embodiments of a method of tuning a speaker to compensate for sound being emitted through upholstery fabric can include: selecting a desired baseline equalization (e.g., desired frequency response), configuring the speaker to emit sound at an actual equalization (e.g., frequency response) approximate to the desired baseline equalization or frequency response; covering the speaker with an upholstery fabric; measuring a resultant equalization or frequency response as the speaker emits sound through the upholstery fabric; calculating a differential equalization; and reconfiguring the audio system to emit sound through the upholstery fabric according to the desired baseline equalization or frequency response by adjusting the actual equalization or frequency response by the differential equalization. Methods can also include creating a plurality of tuning profiles corresponding to a plurality of upholstery fabrics, each tuning profile including a differential equalization calculated for each of the plurality of upholstery fabrics.

Systems of the present disclosure also include audio-enhanced modular furniture systems having: a modular furniture assembly including one or more bases, a plurality of upright members, at least two of the upright members being audio-enhanced upright members, and a speaker system positioned within the modular furniture assembly. The speaker system can include (a) at least one speaker mounted within a first audio-enhanced upright member, the at least one speaker being hidden from view by a first upholstery fabric that covers the first audio-enhanced upright member; (b) at least one speaker mounted within a second audio-enhanced upright member, the at least one speaker being hidden from view by a second upholstery fabric that covers the second audio-enhanced upright member; and (c) at least one speaker controller configured to control each speaker of the speaker system. Each speaker of the speaker system can be configured to be tuned through the at least one speaker controller to compensate for sound being emitted from the speaker through the respective first or second upholstery fabric by adjusting the equalization of one or more audio frequencies emitted by the at least one speaker.

Methods of the present disclosure can also include methods for tuning speakers in modular furniture including (a) providing an assemble-able modular furniture assembly having one or more bases, a plurality of upright members, wherein at least one of the upright members is an audio-enhanced upright member, and a speaker system including at least one speaker mounted within the first audio-enhanced upright member, the at least one speaker being hidden from view by a first upholstery fabric that covers the first audio-enhanced upright member; and (b) tuning the at least one speaker mounted within the first audio-enhanced upright member to compensate for sound being emitted from the at least one speaker through the first upholstery fabric by adjusting the decibel level of one or more audio frequencies emitted by the at least one speaker.

Accordingly, systems and methods for acoustically correcting sound loss through fabric are disclosed.

This Brief Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 7 is an illustrative table of audio frequency adjustments for acoustically correcting sound loss through fabric according to embodiments of the present invention.

FIG. 8A is a table of audio frequency adjustments for acoustically correcting sound loss through an exemplary upholstery fabric including a polyester material.

FIG. 8B is a table of audio frequency adjustments for acoustically correcting sound loss through an exemplary upholstery fabric including a chenille material.

FIG. 8C is a table of audio frequency adjustments for acoustically correcting sound loss through an exemplary upholstery fabric including a tweed material.

FIG. 8D is a table of audio frequency adjustments for acoustically correcting sound loss through an exemplary upholstery fabric including a linen material.

FIG. 8E is a table of audio frequency adjustments for acoustically correcting sound loss through an exemplary upholstery fabric including a velvet material.

FIG. 8F is a table of audio frequency adjustments for acoustically correcting sound loss through an exemplary upholstery fabric including a leather material.

FIG. 8G is a table of audio frequency adjustments for acoustically correcting sound loss through an exemplary upholstery fabric including a polyester linen material.

FIG. 8H is a table of audio frequency adjustments for acoustically correcting sound loss through an exemplary upholstery fabric including a faux fur material.

DETAILED DESCRIPTION

Figure 1:
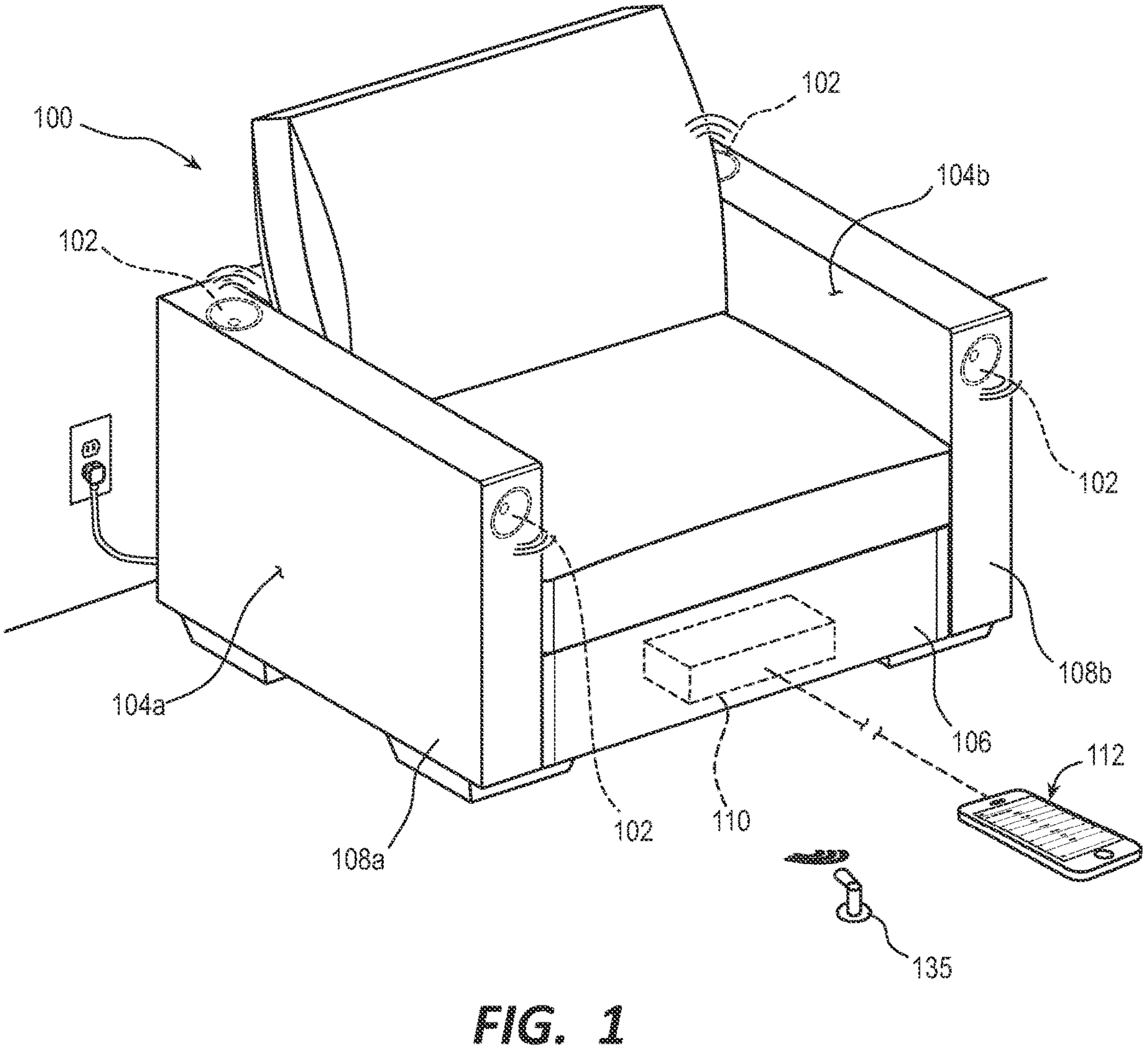
FIG. 1 illustrates a perspective view of a modular furniture assembly having audio speakers mounted thereto, each audio speaker being covered by an upholstery fabric.

One or more specific embodiments of the present disclosure will be described below. In an effort to provide a concise description of these embodiments, some features of an actual embodiment may be described in the specification. It should be appreciated that in the development of any such actual embodiment, as in any engineering or design project, numerous embodiment-specific decisions will be made to achieve the developers' specific goals, such as compliance with system-related and business-related constraints, which may vary from one embodiment to another. It should further be appreciated that such a development effort might be complex and time consuming, but would nevertheless be a routine undertaking of design, fabrication, and manufacture for those of ordinary skill having the benefit of this disclosure.

One or more embodiments of the present disclosure may generally relate to apparatuses, methods, and systems for acoustically correcting sound loss through various types and compositions of fabric. The apparatuses, methods, and systems provide superior sound quality to speaker systems that include at least one speaker covered with fabric. The apparatuses, methods, and systems are used to improve the balance of audible frequencies emitted by a speaker through a fabric covering. The apparatuses, methods, and systems can use various mechanical, electromechanical, electrical, hardware and/or software components, systems, and modules to improve audio or speaker systems integrated within furniture, whether it be a modular furniture assembly or a single integral furniture unit having integrated speakers.

While the present disclosure will describe particular implementations of apparatuses, methods, and systems, it should be understood that the apparatuses, methods, and systems described herein may be applicable to other uses. Additionally, elements described in relation to any embodiments depicted and/or described herein may be combinable with elements described in relation to any other embodiment depicted and/or described herein.

For instance, "tuning" of a speaker or system of speakers, as discussed throughout the present disclosure, is to be understood to encompass all methods currently known for adjusting the frequency response of the subject speaker or system of speakers. Such methods include but are not limited to adjustment of the equalization of frequencies of a sound signal prior to transmission to the speaker or speaker system, adjustment of a transmitted audio signal prior to its receipt by the speaker or speaker system, or direct modification of the speaker(s).

The disclosed embodiments bring about substantial benefits, improvements, and practical implementations to the technical field. By way of example and not limitation, the improved tuning of audio or speaker systems having speakers covered with fabric provides superior sound quality in applications where it is desired to have a speaker concealed from view. This leads to substantial opportunities for improved aesthetic and functional designs of speaker systems integrated with furniture, thereby leading to substantial improvements in the technical field. These and numerous other benefits will now be discussed in more detail with regard to the Figures presented by this disclosure.

The following section outlines some example improvements and practical applications provided by the disclosed embodiments. It will be appreciated, however, that these are just examples only and that the embodiments are not limited to only these improvements. Generally, now referring to the drawings in detail wherein like reference numerals are used to designate like elements, there is shown one or more embodiments of the present disclosure that provides apparatuses, methods, and systems.

Embodiments of the present disclosure are applicable to a variety of applications wherein audio speakers are covered with fabric not only to improve the aesthetic design of an audio system, but to provide desired aesthetics and durability in a furniture system (e.g., a chair, sofa or other furniture providing seating, or a bed). One such application can be found in audio-enhanced furniture systems including a furniture assembly, an upholstery fabric at least partially covering the furniture assembly, and an audio or speaker system positioned within the furniture assembly, wherein at least one of the speakers is covered and hidden from view by the upholstery fabric that at least partially covers the furniture assembly. According to embodiments of the present disclosure, each speaker that is covered by an upholstery fabric can be tuned to compensate for sound being emitted from the speaker through the upholstery fabric by an adjustment to an equalization or frequency response of the speaker at one or more target frequencies or frequency bands. In particular, adjustment of the equalization or frequency response of the speaker may depend on at least one of a fabric type, a density, a thickness, and a weight of the upholstery fabric covering the furniture assembly. In some embodiments, the tuning of each speaker, or tuning of the audio system or speaker system to change the frequency response of each speaker, is selectable from a plurality of tuning profiles corresponding to a variety of upholstery fabrics, such that a user, retailer, or manufacturer is able to select a tuning profile configured to specifically compensate for sound loss through a particular upholstery fabric.

The density and thickness of the upholstery fabric relate to the weight of the upholstery fabric. For instance, a higher density and thicker upholstery fabric can have a higher weight than a lower density and less thick upholstery fabric. Examples of weights of upholstery fabrics that can be used as covers for the furniture assemblies (and modular components/members thereof) of the present invention include, for example: fabrics having weights in a range of approximately 50 grams per square meter (GSM) to approximately 1500 grams per square meter (GSM), for example, such as approximately 100 GSM to approximately 1000 GSM, or such as approximately 190 GSM to approximately 800 GSM, although a variety of different interior and exterior fabrics may be employed. The speakers of the present invention are adjusted and tuned in order to emit sound through such fabrics in a manner that attenuation due to such fabric is compensated for.

Embodiments of a tuning profile include the information used to adjust the equalization of frequency response of a speaker to compensate for sound loss through a particular upholstery fabric. For example, a range of audible frequencies emitted by a speaker can be divided into a plurality of frequency bands, with each of those frequency bands having a frequency response adjustment to compensate for sound loss through a particular upholstery fabric. The particular grouping of those frequency response adjustments, with a particular identification for the particular upholstery fabric can be an example of a tuning profile.

The total quantity of frequency bands depends on the desired level of accuracy in adjustment of the frequency response, as well as the capability of the intended equipment for implementing the tuning profile. For example, some audio tuning devices, such as speaker controllers, amplifiers, or audio equalizers, are only capable of adjusting frequencies in the three frequency bands corresponding to low frequency ranges (i.e., bass), middle frequency ranges, and high frequency ranges (i.e., treble), whereas other tuning devices available are operable to adjust up to 31 separate frequency ranges.

Some of the embodiments discussed herein, for example, divide the audible frequencies ranging from about 20 Hz to about 21 kHz into the 10 frequency bands for individual adjustment as illustrated in Table 1 below: about 20 Hz to about 49 Hz, about 50 Hz to about 99 Hz, about 100 Hz to about 199 Hz, about 200 Hz to about 399 Hz, about 400 Hz to about 999 Hz, about 1 kHz to about 1.9 kHz, about 2 kHz to about 3.9 kHz, about 4 kHz to about 7.9 kHz, about 8 kHz to about 15.9 kHz, and about 16 kHz to about 21 kHz.

TABLE 1

| Frequency Bands | | | | | | | | | |
|---|---|---|---|---|---|---|---|---|---|
| 20-49 Hz | 50-99 Hz | 100-199 Hz | 200-399 Hz | 400-999 Hz | 1000-1999 Hz | 2-3.99 kHz | 4.00-7.99 kHz | 8.00-15.99 kHz | 16.00-21 kHz |

Alternatively, a plurality of target frequencies within the audible frequency range can be selected for adjustment by parametric equalization or similar known methods. Parametric equalization includes adjustment of one or more target frequencies by a selected amplitude, such the frequency response curve of the tuned speaker is altered by a parametric or "bell" shape centered at the target frequency. The particular data associated with the parametric equalization for one particular upholstery fabric, with a particular identification for the particular upholstery fabric can be another example of a tuning profile. One skilled in the art should appreciate that additional methods of adjusting equalization or frequency response not discussed herein can be used to implement the disclosed embodiments within the scope and spirit of the disclosed invention.

The terms "equalization" and "frequency response" are used interchangeably herein to describe adjustments to the output volumes of one or more frequencies within the audible spectrum of sound emitted by a speaker or speaker system.

Referring now to the drawings, FIG. 1 illustrates a modular furniture assembly 100 having an embedded speaker system including multiple audio speakers 102 integrated with modular furniture assembly 100, each audio speaker 102 being covered by an upholstery fabric 104*a*, 104*b*. As illustrated, modular furniture assembly 100 includes a base 106, and first and second audio-enhanced upright members 108*a*, 108*b*, each audio-enhanced upright member 108*a*, 108*b* having, in the illustrated configuration, two audio speakers 102 mounted thereto. First and second upholstery fabrics 104*a*, 104*b* cover first and second audio-enhanced upright members 108*a*, 108*b*, thus also covering each of speakers 102 embedded within upright members 108*a*, 108*b*. Modular furniture assembly 100 can also include a variety of additional components, such as cushions, feet, additional bases and upright members (audio-enhanced or not), and additional embedded speakers.

According to embodiments of the present disclosure, the system of speakers 102 covered by upholstery fabric 104*a*, 104*b*, are tuned to compensate for sound being emitted from each speaker 102 through upholstery fabric 104*a*, 104*b* by an adjustment to an equalization (i.e., adjustment of the frequency response) of the at least one speaker at one or more target frequencies or frequency bands. Adjustment of the equalization of one or more target frequencies or frequency bands depends on at least one of a fabric type, a density, a thickness, and a weight of upholstery fabric 104*a*, 104*b*.

Further, the tuning of speakers 102 can be implemented by one or more speaker controllers in communication with and configured to control the tuning of each speaker 102. For example, modular furniture assembly 100 includes a receiver/amplifier 110, such being an example of a speaker controller, configured to receive signals from an audio source, such as mobile device 112 (via wired connection or wireless signal) and operable to transmit the received signals and provide power to speakers 102. Tuning of speakers 102 can thus be implemented by receiver/amplifier 110 via firmware or other known methods for adjusting the equalization of the output of an amplifier. Alternatively, tuning can be implemented by adjusting the equalization of the audio signals transmitted by the audio source (e.g., by execution of tuning software on mobile device 112). Additionally, the tuning of speakers 102 can be made selectable by mobile device 112, or by any means for communicating with the receiver/amplifier 110, such as a remote controller, a control console, mobile device, such as a cellular phone, or combinations, modifications, or alternatives thereof. Alternatively, the tuning can be permanently implemented via firmware associated with receiver/amplifier 110. In some embodiments, a microphone 135 is also provided to enable custom tuning of speakers 102 according to the methods disclosed herein. Alternatively, the disclosed methods can be performed by the consumer using a microphone of mobile device 112.

While modular furniture assembly 100 is depicted with receiver/amplifier 110 mounted within base 106, embodiments also include receivers, amplifiers, and/or speaker controllers provided at virtually any location that allows for communication with speakers 102. For example, receiver/amplifier 110 can be integral with a center console or similar device, and can be connected to speakers 102 via wired or wireless connections. Alternatively, each speaker 102 can have a speaker controller individually associated therewith and secured directly or proximate thereto. One skilled in the art should appreciate that the illustrated embodiments are provided as exemplary configurations and do not limit the scope or spirit of the present disclosure to the physical configuration specifically illustrated.

While mobile device 112 is illustrated as an exemplary audio source, it will be appreciated that any of a wide variety of sources may be used with the present systems (e.g., including, but not limited to TV, disc player such as a CD player, DVD player, Blu-ray player, over-the air radio, TV or other transmissions, etc.). Additionally, the mobile device 112 can be used not only as an audio source, but can optionally control other audio sources, such as those described herein, and so allow a user to tune the speakers 102 based upon the signals received by other audio sources. For instance, and not by way of limitation, the mobile device 112 can tune the speakers 102 based upon a TV, disc player such as a CD player, DVD player, Blu-ray player, over-the air radio, TV or other transmissions, etc. providing a signal to the receiver/amplifier 110. The mobile device 112 can, therefore, be another speaker controller.

Figure 2A:
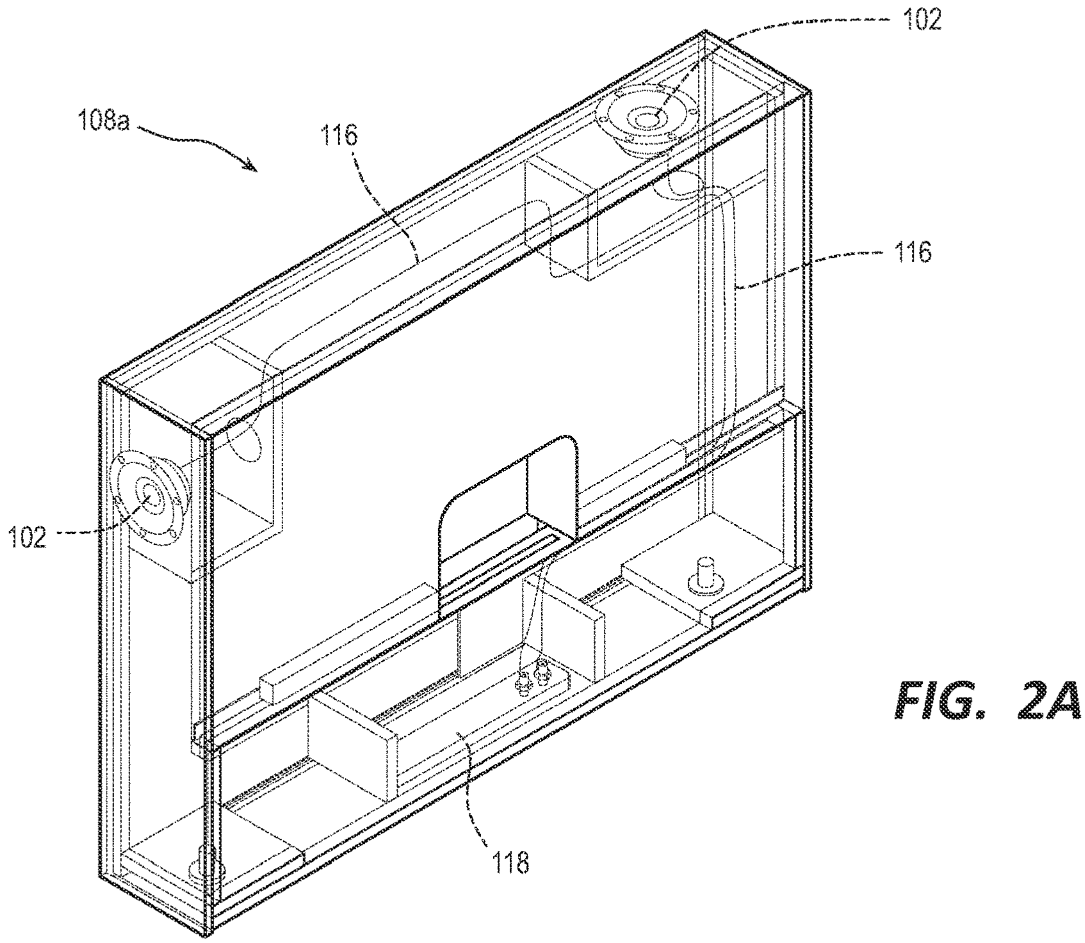
FIG. 2A illustrates a perspective view of an upright member of a modular furniture assembly having audio speakers mounted thereto.
Figure 2B:
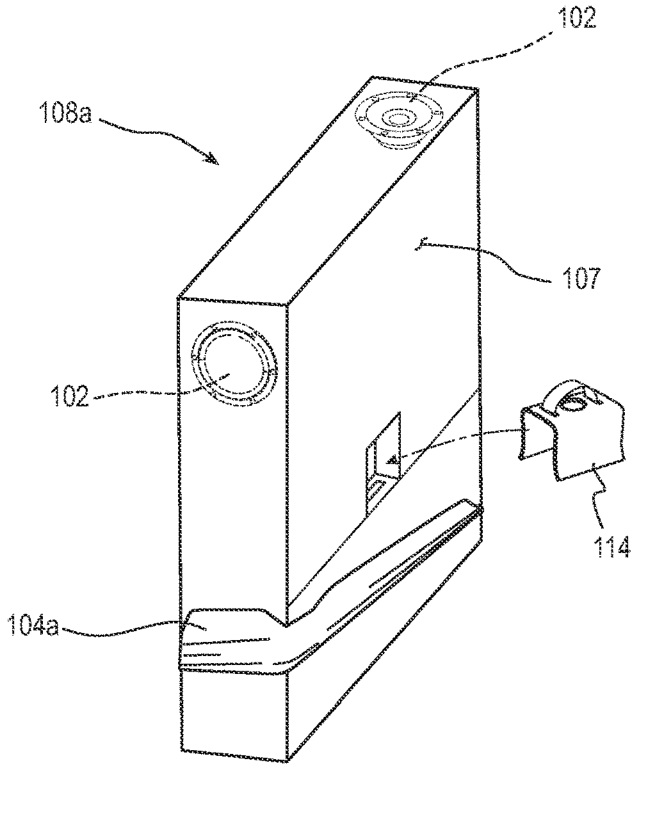
FIG. 2B illustrates a perspective view of the upright member of FIG. 2A with a removable upholstery fabric cover being applied thereto.

FIGS. 2A-2B demonstrate an example upright member 108*a* of an assemble-able modular furniture assembly, such as furniture assembly 100 of FIG. 1, having audio speakers 102 mounted to an internal framework thereof. A fabric cover 104*a* including an upholstery fabric 107 is operable to cover upright member 108*a*, thus covering and concealing speakers 102 from view. Fabric cover 104*a* can thus be removed from upright member 108*a* to be cleaned, to enable access to and maintenance of speakers 102 and any other components mounted within upright member 108*a*, or to exchange the fabric cover 104*a* with another cover designed to fit upright member 108*a*. In some embodiments, consumers may select one or more interchangeable fabric covers 104*a* from a catalog of upholstery fabrics 107. Available upholstery fabrics include but are not limited to polyester, chenille, tweed, linen, polyester linen, velvet, leather, cotton, cotton blend, denim, twill, or faux fur. As shown, a coupler 114 is provided to enable upright member 108*a* to be selectively and securely mounted to a base, such as base 106 of FIG. 1. Although upright member 108*a* is shown in detail in FIGS. 2A-2B, it will be appreciated that upright member 108*b* may be similarly configured, but in a mirror configuration to upright member 108*a*, as apparent from FIG. 1.

As shown in FIG. 2A, each speaker 102 of upright member 108*a* is connected by a wire 116 to a speaker controller 118. Alternatively, speaker 102 can be in wireless communication with speaker controller 118, or individual speaker controllers can be directly integrated with each speaker 102. Speakers 102 can be tuned, according to the methods described herein, to account for sound loss through a variety of upholstery fabrics 107. For example, speaker controller 118 can include firmware operable to adjust one or more target frequencies or frequency bands emitted by speakers 102, depending on the particular fabric within which the speaker is covered. Alternatively, the frequency response of speakers 102 can be adjusted by altering the signal received and transmitted by speaker controller 118 to speakers 102. In any case, the signal sent to any given speaker may be altered to "boost" one or more target frequencies or frequency ranges of the audio signal before transduction of such signal by the speaker. The amount of such "boost" will depend on the particular fabric with which the speaker 102 is covered, as exemplified by FIGS. 7-8H.

Figure 2C:
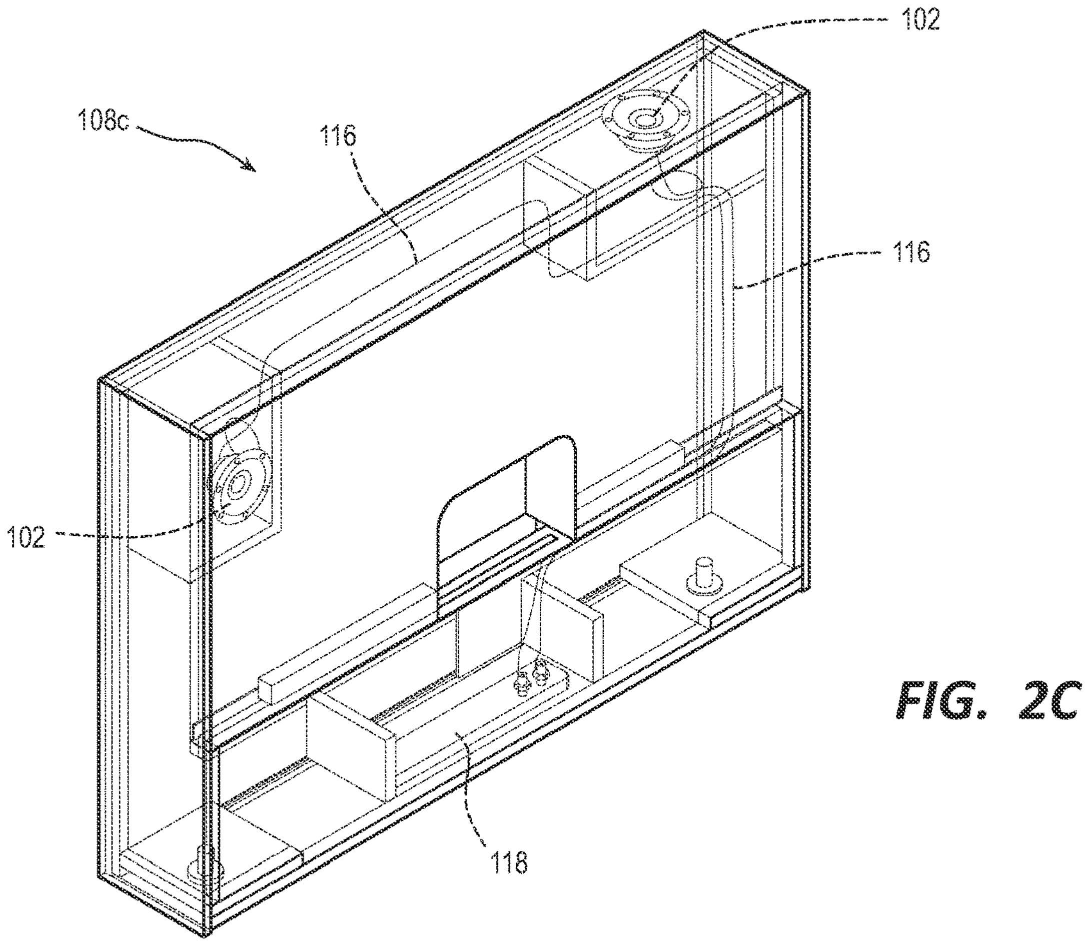
FIG. 2C illustrate a perspective view of another upright member of a modular furniture assembly having audio speakers mounted thereto.
Figure 2D:
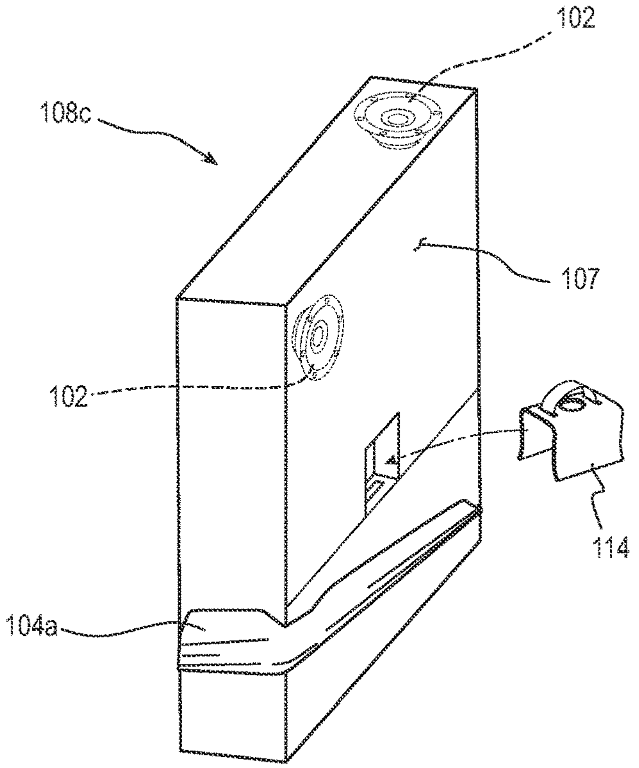
FIG. 2D illustrates a perspective view of the upright member of FIG. 2C with a removable upholstery fabric cover being applied thereto.
Figure 2E:
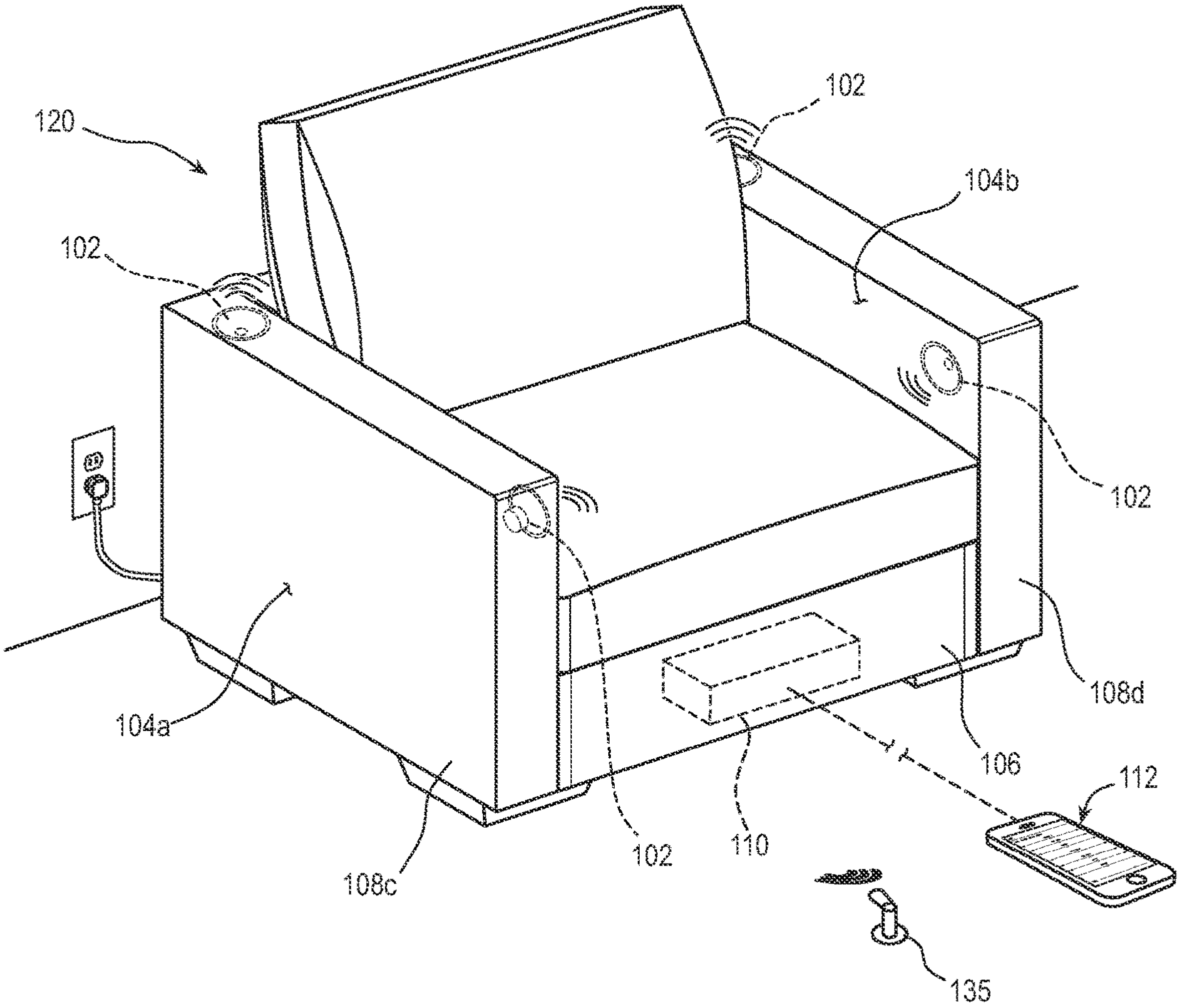
FIG. 2E illustrates a perspective view of a modular furniture assembly formed using upright members with speakers positioned therein as shown in FIGS. 2C-2D.

FIGS. 2A-2B illustrate an upright member configuration where the illustrated audio-enhanced upright member includes two speakers mounted therein, for example, with a front channel speaker positioned in a front edge of the upright member (near a top of the front edge), and a surround speaker positioned in a top edge of the upright member (near a rear of the top edge). FIGS. 2C-2D are similar to FIGS. 2A-2B, but show an alternative speaker placement, where the front channel speaker 102 is positioned in an inside face of the upright member 108*c* (e.g., near the top, front corner), and the surround speaker 102 is positioned similar to that shown in FIGS. 2A-2B, in a top edge of the upright member 108*c*, near a rear of the top edge of the upright member. The configuration seen in FIGS. 2C-2D may thus include front channel speaker placement such that the sound is emitted directly towards the seating position on a chair or sofa. FIG. 2E illustrates such a chair 120, including upright members 108*c*, 108*d*, configured as shown in FIGS. 2C-2D. The configuration of FIGS. 2A-2B includes a front channel speaker placement that may rely on reflection of sound emitted from the front channel speakers off a front wall, TV or the like, for reflection back to the user seated on the chair or sofa. It will be apparent that many alternatives are possible, for placement and positioning of the speakers within the upright members. Any of such may benefit from the embodiments described herein, whereby equalization is applied to the audio signal to compensate for the sound from the speakers being emitted through upholstery fabric that covers the speakers.

FIGS. 3A-3D illustrate perspective views of modular furniture assemblies 122*a-d* of various configurations, each having multiple audio speakers 102 mounted thereto, each audio speaker 102 being covered by an upholstery fabric 104. As illustrated, a variety of furniture configurations can be achieved by rearrangement of the various bases 106 and upright members 108, and by introducing additional members. Also, interchangeable fabric covers can be provided, such that the consumer may select the upholstery fabric 107 for the entire assembly or for each individual member of the assembly. Embodiments of the present disclosure enable tuning of any speaker covered by fabric to account for sound loss through virtually any fabric.

Figure 3A:
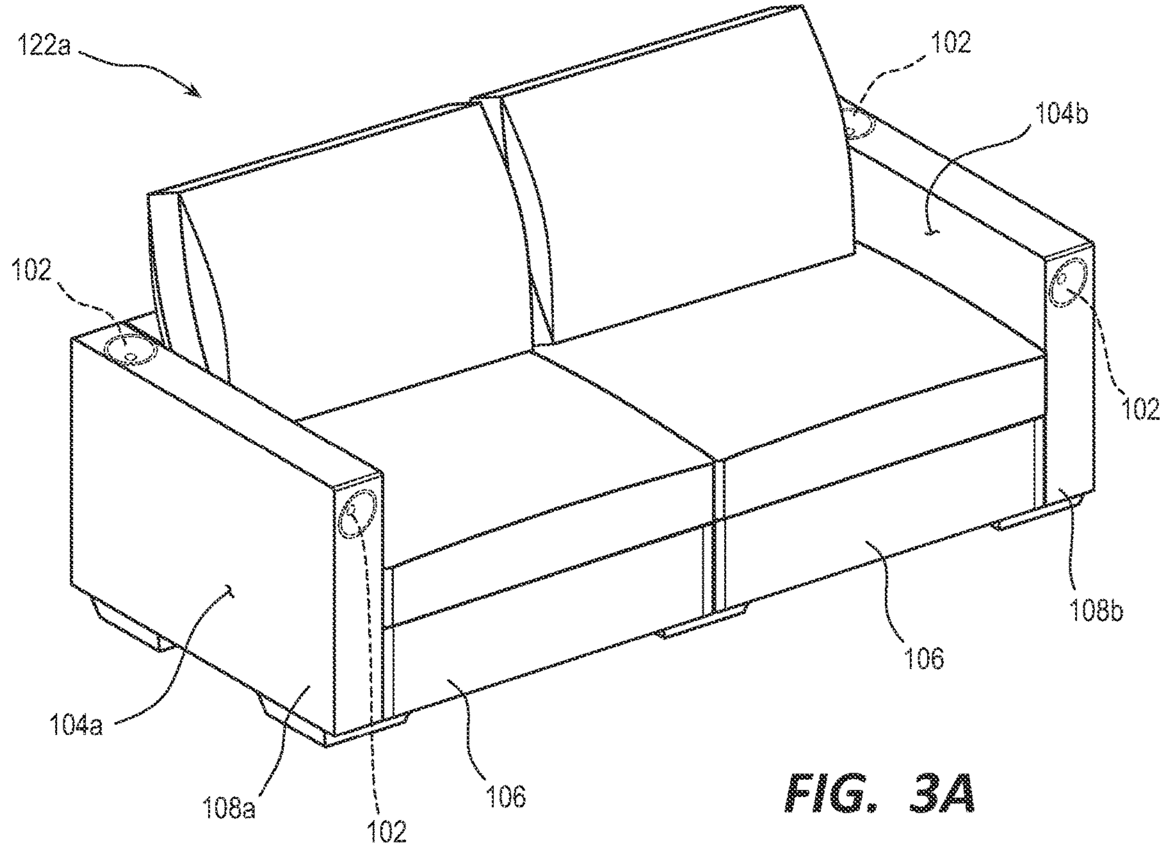
FIGS. 3A-3D illustrate perspective views of modular furniture assemblies of various configurations, each having audio speakers mounted thereto, each audio speaker being covered by an upholstery fabric.

As shown in FIG. 3A, modular furniture assembly 122*a* includes two audio-enhanced upright members 108*a-b*, each arranged relative to bases 106 to act as armrests. Audio-enhanced upright members 108*a-b* each have two speakers 102 mounted thereto, one speaker facing forward and one speaker facing upward. Each of speakers 102 are positioned underneath upholstery fabric covers 104*a* or 104*b* covering respective audio-enhanced upright members 108*a* or 108*b*. Each speaker 102 may be tuned so that sound emitted from the speaker compensates for sound loss though respective upholstery fabric covers 104*a* or 104*b*.

Figure 3B:
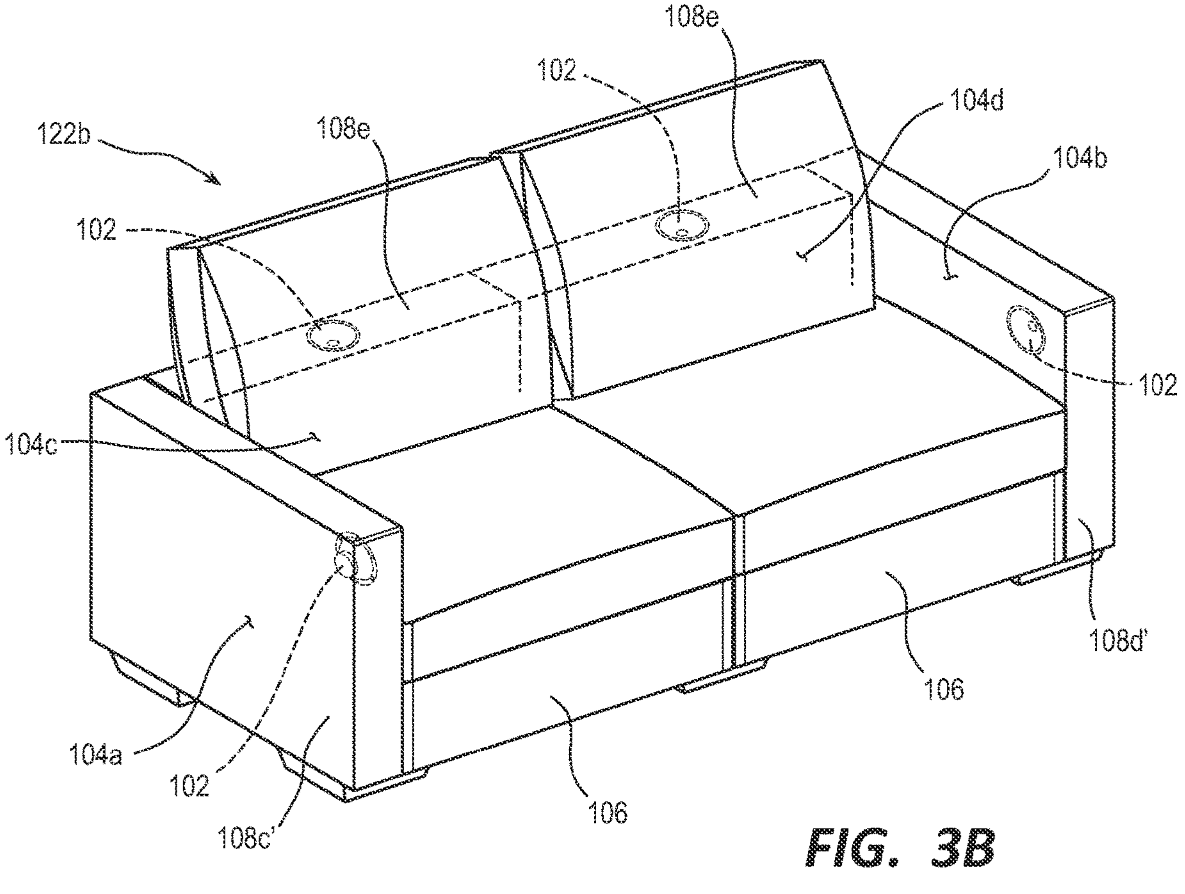

FIG. 3B illustrates a modular furniture assembly 122*b* having four audio-enhanced upright members 108*c*', 108*d*', 108*e*, each having a single speaker 102 mounted thereto. Audio-enhanced upright member 108*c*' and 108*d*' each act as an armrest and include a speaker 102 oriented inward, towards bases 106, whereas audio-enhanced upright members 108*e* each provide a backrest and include a speaker 102 oriented upward and positioned behind respective bases 106. Also, each audio-enhanced upright member 108*c*', 108*d*', 108*e* is covered in an upholstery fabric cover 104*a-d*, such that each speaker 102 of modular furniture assembly 122*b* is positioned underneath one of upholstery fabric covers 104*a-d*. Accordingly, each speaker 102 of modular furniture assembly 122*b* may be tuned so that sound emitted from the speaker compensates for sound loss though respective upholstery fabric covers 104*a*, 104*b*, 104*c*, or 104*d*. In an embodiment, the various covers of a given furniture assembly may be of the same given material, or of different fabric materials (e.g., one given material on the bases, another on the upright members, or a mix and match configuration between various bases and/or upright members).

Figure 3C:
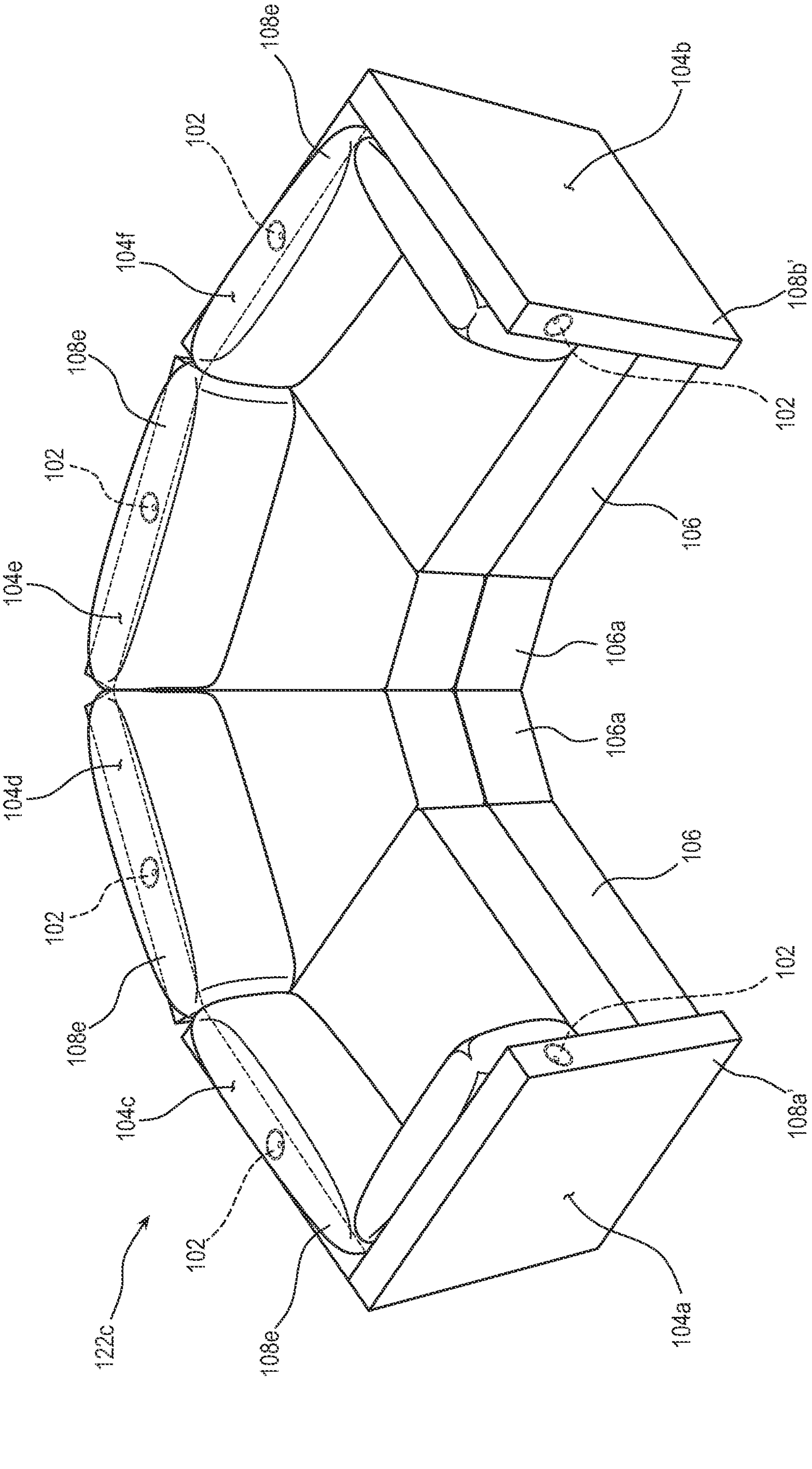

By way of an additional example, FIG. 3C illustrates modular furniture assembly 122*c*, wherein six audio-enhanced upright members 108*a*', 108*b*', 108*e* are arranged about bases 106, 106*a*, where the two bases 106*a* are wedge-shaped to create a curved style of sofa or couch. As shown, audio-enhanced upright members 108*a*' and 108*b*' act as armrests and include mounted speakers 102 oriented forwards, the other audio-enhanced upright members 108*e* acting as backrests and each having a speaker 102 oriented upwards. Upright members 108*c*' and 108*d*' may be similar to upright members 108*c* and 108*d*, except that upright members 108*c*' and 108*d*' are shown as including only a single speaker each (e.g., in the inside face), without any surround speaker. Each of upright members 108*e* may be identically configured to one another, as shown (e.g., with a single surround speaker positioned centrally, within the top edge of the upright member). Upright members 108*a*' and 108*b*' may be similar to upright members 108*a* and 108*b*, except that upright members 108*a*' and 108*b*' are shown as including only a single speaker each (e.g., in the front edge), without any surround speaker. As with the prior examples, each speaker 102 is positioned beneath one of upholstery fabrics covers 104*a-f* and can be tuned to compensate for sound loss through respective upholstery fabric cover 104*a*, 104*b*, 104*c*, 104*d*, 104*e*, or 104*f*.

Figure 3D:
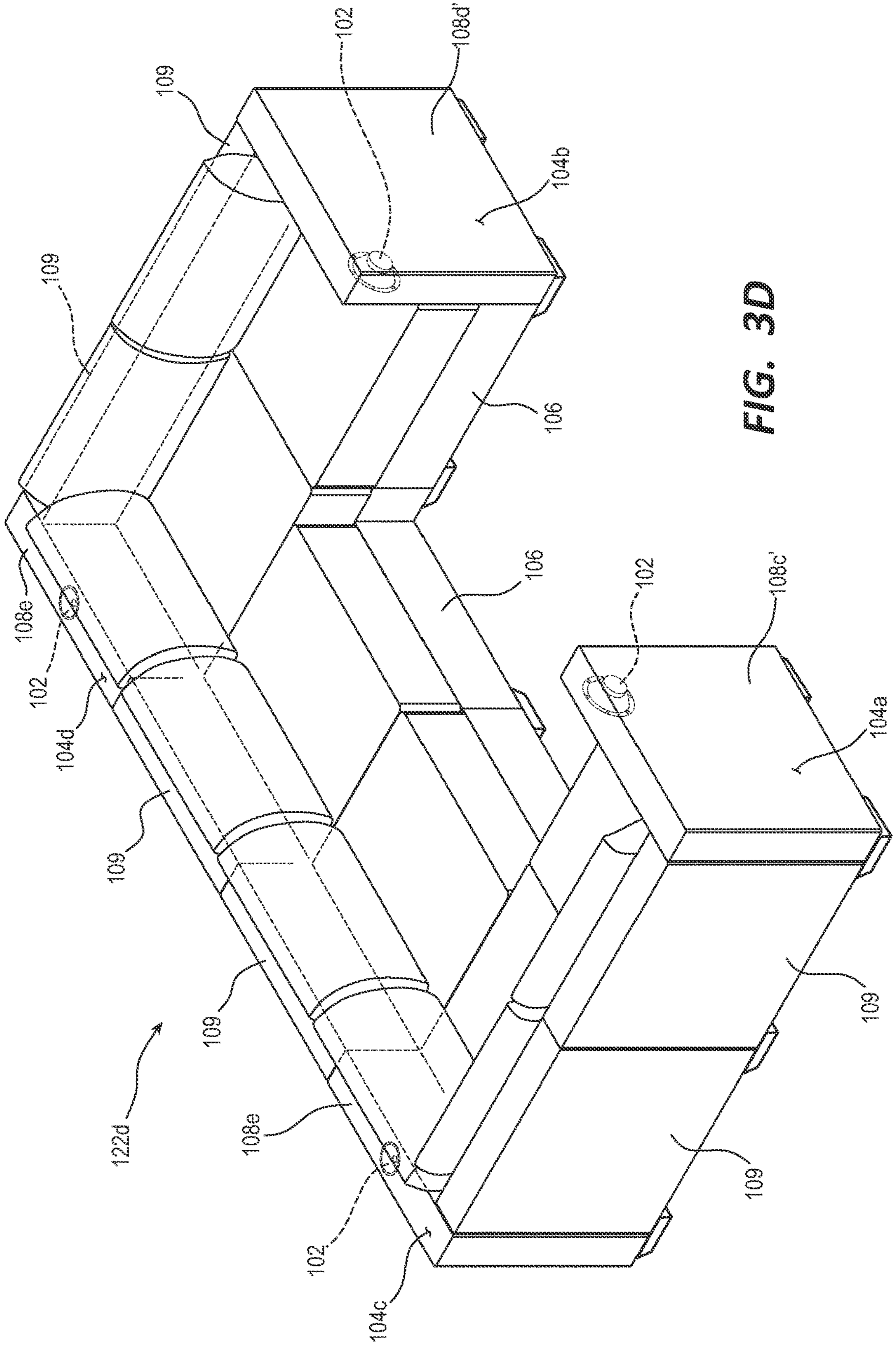

As yet another example, FIG. 3D illustrates modular furniture assembly 122*d* having four audio-enhanced upright members 108*c*', 108*d*', 108*e* and with six bases 106 and several non-audio-enhanced upright members 109 to form a U-shaped sofa or couch. As shown, audio-enhanced upright members 108*c*' and 108*d*' provide armrests and each include a speaker 102 oriented inward, whereas audio-enhanced upright members 108*e* provide backrests and each include a speaker 102 oriented upward. As with the other examples provided, speaker 102 of each audio enhanced upright member 108*c*', 108*d*', 108*e* is positioned beneath respective upholstery fabric covers 104*a-d* and can be tuned to compensate for sound loss through respective upholstery fabric covers 104*a*, 104*b*, 104*c*, and 104*d*.

Although FIGS. 1-3D illustrate particular combinations of specifically configured upright members with various bases, it will be appreciated that any of the described upright members and bases may be used in any combination, with any desired speaker placement, size, or orientation in the upright members, and with any desired placement of the upright members relative to the bases, to provide any of a wide variety of furniture configurations.

Because the speakers are positioned within the modular furniture assembly components, this provides great flexibility to a user in where the speakers can be positioned within the assembled furniture assembly, whether the assembly is modifiable by the user, custom built according to the user's request, or otherwise provided. Further, the use of interchangeable covers for each of the modular furniture assembly components enables the user to change upholstery fabrics at will. Accordingly, embodiments of the present disclosure also enable a user to selectively tune the speakers of an audio-enhanced furniture assembly to compensate for sound loss through the fabric selected by the user, as discussed further herein.

Figure 4A:
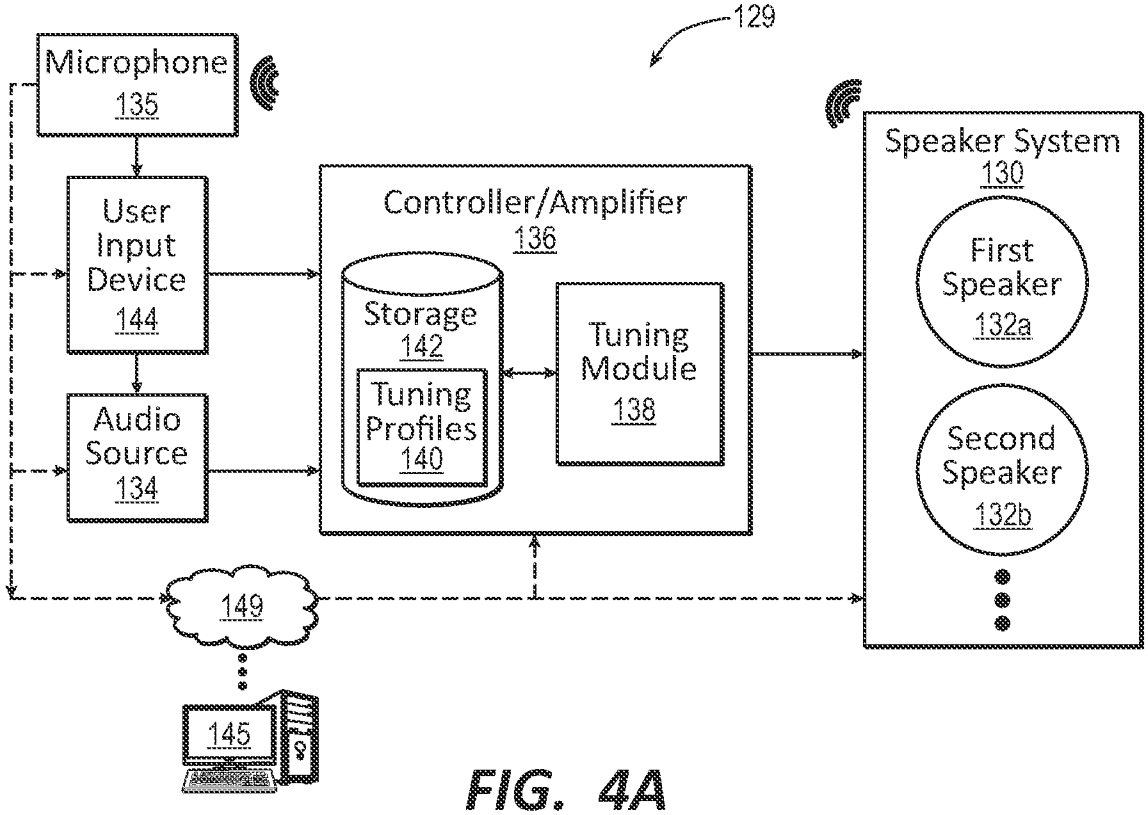
FIGS. 4A-4C illustrate schematics of exemplary audio systems operable to tune speakers to compensate for sound loss through fabric.
Figure 4B:
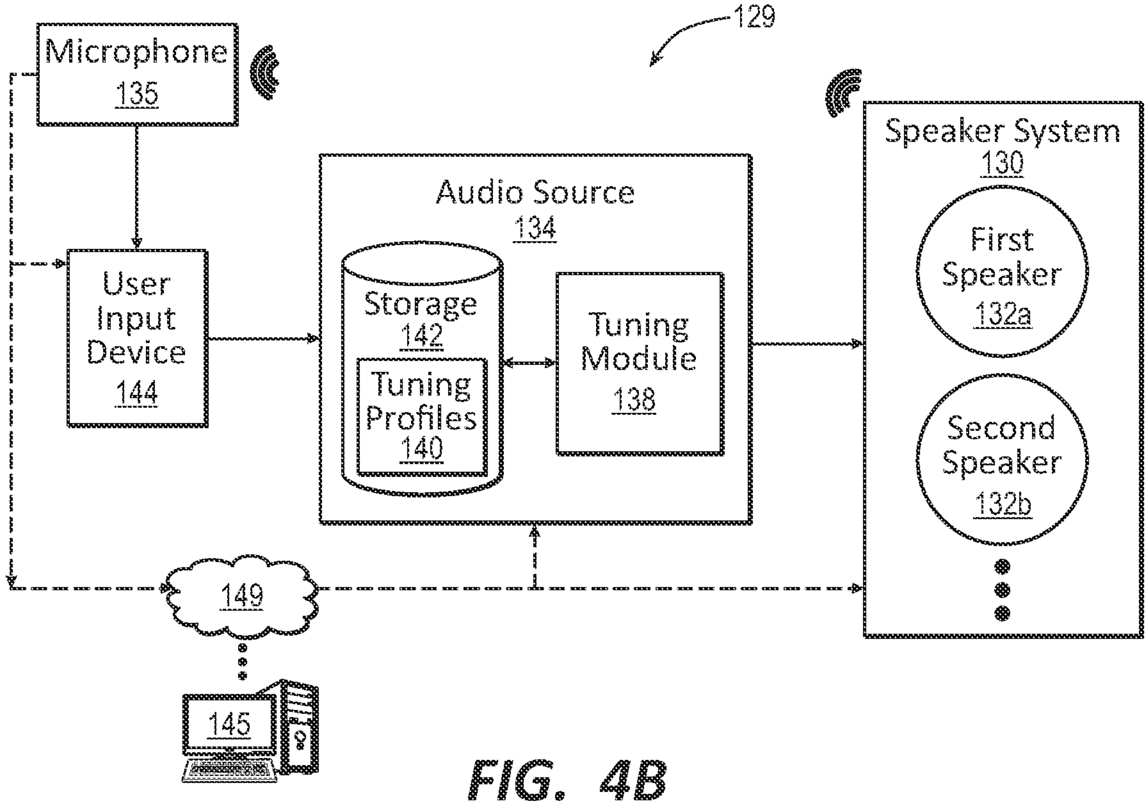
Figure 4C:
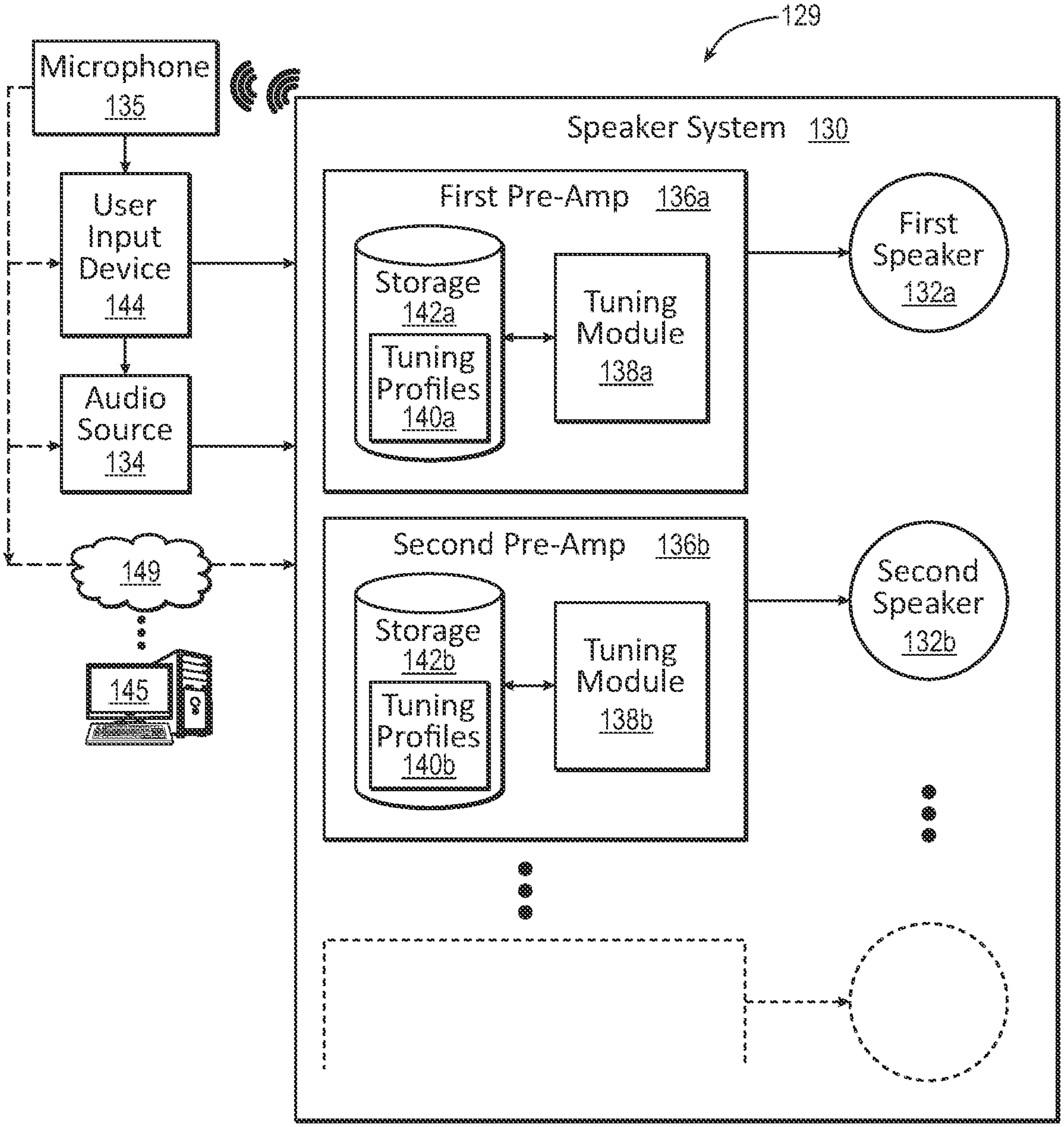

Referring now to FIGS. 4A-4C, schematics of exemplary audio systems operable to tune speakers to compensate for sound loss through fabric are illustrated. As shown, each audio system 129 includes a speaker system 130 having a first speaker 132*a*, a second speaker 132*b*, and any number of additional speakers. Each audio system 129 also includes an audio source 134 configured to transmit audio signals to be emitted by speaker system 130, as well as a user input device 144 operable to control various aspects of the audio system 129, such as adjustment of the output of audio source 134 or modification of one or more settings of controller or amplifier 136. User input device 144 can be a separate component of the audio system 129, such as a console, remote controller, or a mobile device, or can be an integral component of audio source 134, such as a user interface on an audio receiver. One should appreciate that the provided exemplary audio systems 129 are for illustrative purposes and do not limit the scope of the present disclosure.

In the example illustrated by FIG. 4A, a controller or amplifier 136 includes a tuning module 138 operable to adjust one or more frequencies or frequency bands of a received audio signal as it is transmitted to speaker system 130 by amplifier 136. Tuning module 138 can be implemented, for example, by firmware directly integrated with amplifier 136. In some embodiments, a tuning profile 140 is selectable from a plurality of tuning profiles 140 stored within a storage 142 associated with the controller or amplifier 136. For instance, tuning module 138 may incorporate a tuning profile associated with a particular upholstery fabric in response to a user's selection of a tuning profile from tuning profiles 140 via user input device 144. Controller or amplifier 136 can be operable to tune speaker system 130 as a whole, or to tune each individual speaker 132 separately, or both. By incorporating the tuning module within amplifier 136, speaker system 130 can be tuned irrespective of audio source 134.

Alternatively, the exemplary audio system 129 of FIG. 4B illustrates an audio source 134 having a tuning module 138 operable to tune speaker system 130 to compensate for sound loss through fabric by selection of a tuning profile from a plurality of tuning profiles 140 from a storage device 142 of audio source 134. Accordingly, a user input device 144 can be used to select a tuning profile 140 corresponding to a particular fabric, and tuning module 138 can apply the selected tuning profile 140 to adjust the equalization or frequency response of speaker system 130 at one or more target frequencies or frequency bands. By incorporating tuning module 138 within audio source 134, an existing speaker system 130 can be tuned without the need for a specialized amplifier or controller.

As illustrated in FIG. 4C, another alternative exemplary audio system 129 includes a speaker system 130 wherein first and second pre-amps 136*a*, 136*b* are associated with respective first and second speakers 132*a*, 132*b* to independently tune each speaker 132*a*, 132*b* for sound loss through fabric, thus enabling each speaker to be covered by a different upholstery fabric and still be tuned with a fabric-specific tuning profile. Accordingly, each pre-amp 136*a*, 136*b* includes a respective storage device 142*a*, 142*b* from which a tuning profile is selectable from a plurality of tuning profiles 140*a*, 140*b*. A user can thus select a tuning profile for each individual speaker 132 by use of user input device 144, such that the equalization of an audio signal received from audio source 134 by respective pre-amps 136*a*, 136*b* is adjusted prior to transmission to respective speakers 132*a*, 132*b*. In an embodiment, all speakers (e.g., 132*a*, 132*b*, etc.) within the system may have the same tuning profile 140 applied thereto (e.g., all speakers adjusted to compensate for sound emission through a given upholstery fabric). Alternatively, each speaker may have a different individual tuning profile 140 applied thereto when different fabrics are applied to cover each speaker.

Embodiments also include methods and systems for enabling speaker system 130 to be configured by a user to account for sound loss through any fabric covering speakers 132*a*, 132*b*, etc. of speaker system 130 without a predetermined tuning profile (i.e., methods allowing a user to create a new tuning profile corresponding to the actual fabric covering speakers 132*a*, 132*b*, etc.). For instance, FIGS. 4A-4C each depict a microphone 135 configured to receive and measure sounds emitted by speaker system 130. As illustrated, microphone 135 is in communication with at least one (or both) of user input device 144 or network 149. The microphone 135 is located outside of the fabric covering each speaker, such that microphone 135 is configured to receive and measure sound as heard as it passes though the fabric.

Such auto-tuning embodiments further includes using the user input device 144 as a computer system that is operable to apply the methods disclosed herein. The user input device 144 is in communication with network 149 and includes a necessary hardware and software for implementing the disclosed methods. Alternatively, a separate personal computer, a mobile device, and so forth could communicate with the microphone 135, either directly or via the network 149. As such, the user input device 144, for instance, is in communication with microphone 135 to receive audio measurements therefrom as speaker system 130 emits a preset sequence of audio tones stored within storage 142, or within a remote computer system communicating with the speaker system 130, or otherwise transmitted to speaker system 130 via audio source 134. Microphone 135 is operable to measure the tones emitted by speaker system 130 through the fabric. Having received the measurements from microphone 135, the user input device 144 is able to calculate adjustments to the equalization of speaker system 130 according to the methods disclosed herein to create a new tuning profile 140 and communicate with tuning module 138 to store the new tuning profile 140 within storage 142 and to implement the tuning profile to adjust the equalization of each speaker 132*a*, 132*b*, etc. of speaker system 130. It will be understood that a separate computer system 145 could apply the methods disclosed herein, including the auto-tuning using the microphone 135.

The schematic illustration of portions of the audio systems described here can be considered as representations of functional modules or components to perform particular operations. Generally, the operation modules, controllers, systems, etc. described herein may refer to software objects or routines that execute on a special purpose processing device to perform a certain function or group of functions. In at least some instances, a hardware processor is provided that is operable to carry out executable instructions for performing a method or process, such as the methods and processes disclosed herein. It is contemplated that implementations in hardware or a combination of software and hardware are possible. For instance, the controllers, modules, systems, etc. described herein may include the use of computer hardware or software modules. Such hardware and software modules or structures may include a processor and computer storage media carrying instructions that, when executed by the processor and/or caused to be executed by the processor, perform any one or more of the methods disclosed herein, or any part(s) of any method disclosed. By way of example, and not limitation, such computer storage media may comprise hardware storage such as solid state disk/device (SSD), RAM, ROM, EEPROM, CD-ROM, flash memory, phase-change memory ("PCM"), or other optical disk storage, magnetic disk storage or other magnetic storage devices, or any other hardware storage devices which may be used to store program code in the form of computer-executable instructions or data structures, which may be accessed and executed by a general-purpose or special-purpose computer system to implement the disclosed functionality of the invention. Combinations of the above should also be included within the scope of computer storage media. Such media are also examples of non-transitory storage media, and non-transitory storage media also embraces cloud-based storage systems and structures, although the scope of the invention is not limited to these examples of non-transitory storage media.

The functionality and operation of the controller/amplifier, user input device, audio source, speaker system, audio system, and other structures and components described herein can be performed, at least in part, by one or more hardware logic components. For example, and without limitation, illustrative types of hardware logic components/processors that can be used include Field-Programmable Gate Arrays ("FPGA"), Program-Specific or Application-Specific Integrated Circuits ("ASIC"), Program-Specific Standard Products ("ASSP"), System-On-A-Chip Systems ("SOC"), Complex Programmable Logic Devices ("CPLD"), Central Processing Units ("CPU"), Graphical Processing Units ("GPU"), or any other type of programmable hardware.

Optionally, while the user input device 144 and audio source 134 are illustrated as communicating directly with the controller/amplifier 136 and/or the speaker system 130 as illustrated in FIGS. 4A-4C, any of the structures described herein can communication and deliver signals between or to other structures via a network 149. A "network," like network 149, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. The controller/amplifier 136, the user device 144, the audio source 134, the microphone 135, the speaker system 130, and the computer system 145 can include one or more communication channels that are used to communicate with the network 149. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Figure 5:
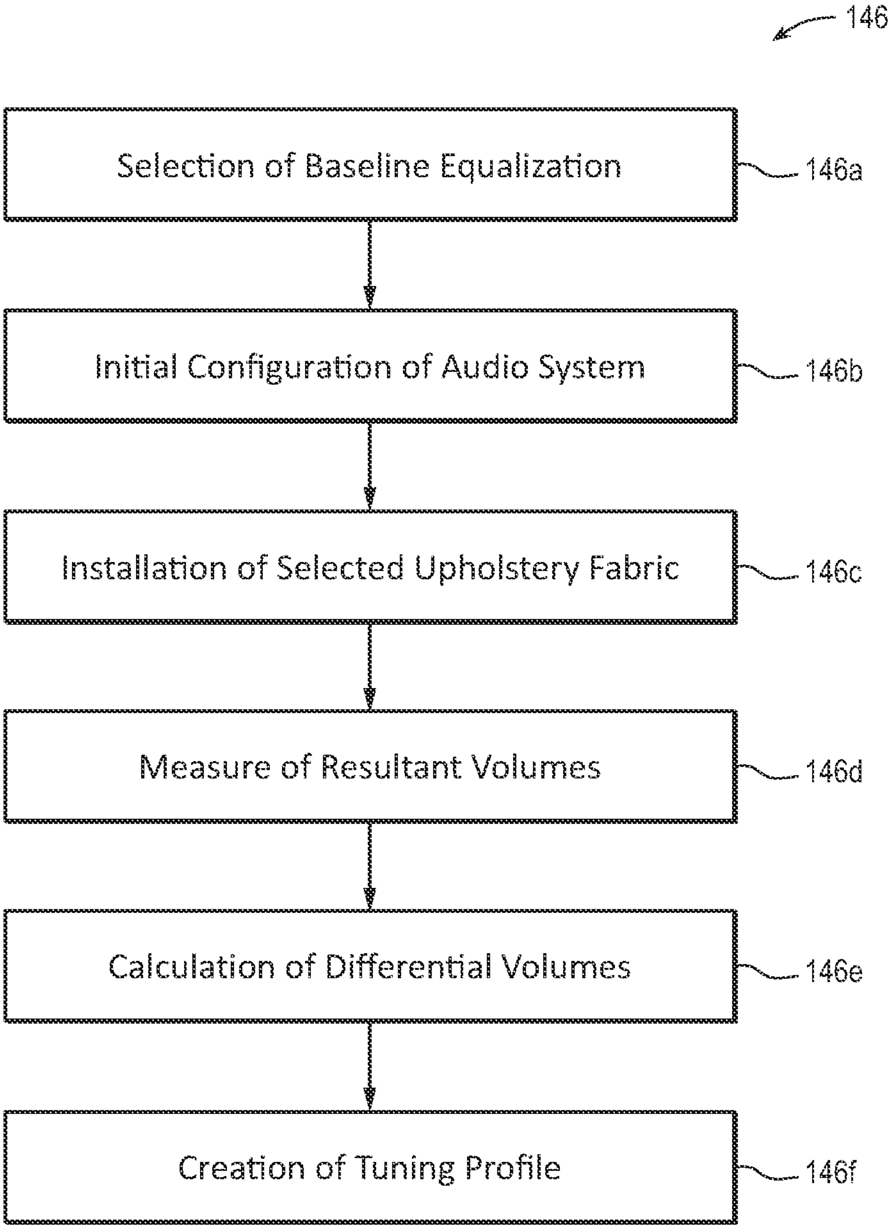
FIG. 5 illustrates a flowchart of a method of the present invention for acoustically correcting sound loss through fabric.

FIG. 5 illustrates a flowchart of a method 146 of the present invention for acoustically correcting sound loss through fabric. More specifically, method 146 includes various acts for creating a tuning profile operable to tune a speaker to compensate for sound loss through a selected upholstery fabric. By way of example (but not limitation), such a method may be performed by a manufacturer or other provider of systems such as those described herein. The method can be performed, for example, by any of the audio systems illustrated in FIGS. 4A-4C.

Method 146 begins with act 146*a* of selecting a baseline equalization of one or more audio frequencies for a speaker of an audio system, such as the audio systems illustrated in FIGS. 4A-4C. Such a baseline equalization may correspond to a desired frequency response curve or, alternatively, may correspond to the unaltered frequency response of a given speaker system at a selected volume level. Embodiments may include virtually any baseline equalization that enables measurement of the volume of each target frequency or frequency band as the speaker emits sound through the fabric for which the speaker is to be tuned. In other words, the volume of each target frequency within the selected baseline equalization needs to be sufficiently high to enable the proceeding method steps to be performed accurately.

As a non-limiting example, baseline decibel levels for each target frequency or frequency band of a baseline equalization can be between about 40 decibels or less, 60 decibels or less, 70 decibels or less, 90 decibels or less, 100 decibels or less, 120 decibels or less, or 130 decibels or less. Stated another way, the baseline equalization can be based upon baseline decibel levels from about 40 decibels to about 130 decibels, from about 60 decibels to about 120 decibels, or from about 70 decibels to about 100 decibels. Further, the baseline decibel levels of each target frequency or frequency band can be adjusted if it is found that the previously selected decibel level is too low to be heard or detected by a microphone, such as microphone 135, as the sound passes through the selected fabric. Further still, methods as disclosed herein may be performed at a variety of baseline decibel levels to determine accurate adjustments to the baseline equalization at each selected decibel level.

In act 146*b*, the audio system is configured to emit each of the one or more target frequencies or frequency bands from the speaker at an actual volume according to the selected baseline equalization. For example, for a frequency range of about 20 Hz to about 21 kHz, the frequency range can include up to 3, up to 5, up to 10, up to 31 target frequencies, or up to one target frequency for each frequency of the range so that for a range from 0 Hz to about 21 kHz there can be 21,000 target frequencies. Stated another way, the full frequency range could be adjusted at each frequency as would be characterized by a continuous equation, or through a step function as would result in bands. A particular frequency range can be divided into a number of frequency bands, such as about 1 to about 21000 target frequency bands, about 1 to about 31 target frequency bands, about 2 to about 20 target frequency bands, about 3 to about 15 target frequency bands, or from about 5 to about 10 target frequency bands. More specifically, as an example only, the following 10 target frequencies can be selected for adjustment: about 32 Hz, about 63 Hz, about 125 Hz, about 250 Hz, about 500 Hz, about 1 kHz, about 2 kHz, about 4 kHz, about 8 kHz, and about 16 kHz. The target frequencies can also be implemented as frequency bands, such as, for example, the following 10 frequency bands, as provided in Table 1: about 20 Hz to about 49 Hz, about 50 Hz to about 99 Hz, about 100 Hz to about 199 Hz, about 200 Hz to about 399 Hz, about 400 Hz to about 999 Hz, about 1 kHz to about 1.9 kHz, about 2 kHz to about 3.9 kHz, about 4 kHz to about 7.9 kHz, about 8 kHz to about 15.9 kHz, and about 16 kHz to about 21 kHz. One skilled in the art should appreciated that adjustment of target frequencies or frequency bands can be implemented by a variety of devices currently available, such as a parametric equalizer, a graphical equalizer, a semi-graphical equalizer, a custom designed equalizer, and so forth.

After the audio system has been configured according to the selected baseline configuration, act 146*c* includes covering the speaker with a selected upholstery fabric. Preferably, the selected upholstery fabric is either the same upholstery fabric as or substantially similar in fabric type, density, thickness, and a weight to an upholstery fabric intended to be used to cover a speaker system product, such as an audio-enhanced furniture assembly, during use.

With the speaker covered by the selected upholstery fabric, act 146*d* includes activating the audio system and measuring a resultant volume of each of the one or more target frequencies as the speaker emits sound through the selected upholstery fabric. The resultant volume of the one or more target frequencies will differ based on the fabrics used to cover the speaker, with the resulting frequency response affected differently, depending at least one of, for example, fabric type, density, thickness, or weight. For example, one fabric may significantly affect certain frequencies while having only a nominal or substantially no effect on others, and an alternative fabric may affect different frequencies by varying amounts, as discussed further herein.

At act 146*e*, a differential volume is calculated between the actual volume of each of the one or more target frequencies from act 146*b* and the resultant volume of each of the one or more target frequencies measured in act 146*d*. These differential volumes can be calculated for any number of audio frequencies, preferably at least for each audio frequency or frequency band that is adjustable by the audio system. When the audio system emits target frequencies, in one example configuration, ranging from about 20 Hz to about 21 kHz, with a baseline ranging from about 70 dB to about 100 dB over the range of about 20 Hz to about 21 kHz, the compensation values can be up to about 25 dB for each of the one or more adjusted frequency bands, with the adjusted frequency bands having a band width of about 1 Hz to about 4000 Hz, from about 2 Hz to about 2000 Hz, from about 3 Hz to about 1000 Hz, from about 4 Hz to about 500 Hz, from about 5 Hz to about 200 Hz, from about 5 Hz to about 100 Hz, from about 5 Hz to about 50 Hz, combinations and/or modification thereof, or some other band width for the selected target frequency or target frequency band. Stated another way, the compensation values can range from about 1 dB to about 25 dB when compensation of a particular frequency band occurs for a particular fabric during tuning. Alternatively, the compensation values can range from about 1 dB to about 30 dB, from about 2 dB to about 21 dB, from about 3 dB to about 16 dB, from about 1 dB to about 21 dB, or from about 1 dB to about 16 dB.

In other examples, the differential volumes can be, as provided in Table 2, up to about 2 dB, about 4 dB, or about 5 dB for a target frequency of about 32 Hz or a frequency band of about 20 Hz to about 49 Hz; up to about 1 dB, about 4 dB, or about 5 dB for a target frequency of about 63 Hz or a frequency band of about 50 Hz to about 99 Hz; up to about 3 dB, about 4 dB, or about 5 dB for a target frequency of about 125 Hz or a frequency band of about 100 Hz to about 199 Hz; up to about 1 dB, about 4 dB, or about 5 dB for a target frequency of about 250 Hz or a frequency band of about 199 Hz to about 399 Hz; up to about 1 dB, about 4 dB, or about 5 dB for a target frequency of about 500 Hz or a frequency band of about 400 Hz to about 999 Hz; up to about 3 dB, about 5 dB, or about 7 dB for a target frequency of about 1 kHz or a frequency band of about 1 kHz to about 1.9 kHz; up to about 8 dB, about 10 dB, or about 12 dB for a target frequency of about 2 kHz or a frequency band of about 2 kHz to about 3.9 kHz; up to about 11 dB, about 14 dB, or about 16 dB for a target frequency of about 4 kHz or a frequency band of about 4 kHz to about 7.9 kHz; up to about 15 dB, about 18 dB, or about 20 dB for a target frequency of about 8 kHz or a frequency band of about 8 kHz to about 15.9 kHz; and up to about 16 dB, about 21 dB, or about 25 dB for a target frequency of about 16 kHz or a frequency band of about 16 kHz to about 21 kHz. It is to be understood that the foregoing volume adjustments include lower magnitude adjustments below the presented upper limit, such as, for example, increasing the volume of each target frequency or frequency band expressed above by a magnitude from about 1 decibel to the presented maximum number of decibels.

The foregoing adjustments are provided as examples and are not intended to limit the scope of the present disclosure. For instance, while certain differential volumes are provided in each of Examples 1-3, it will be understood that any differential volumes from any examples can be combined together. For instance, any differential volumes of Example 1 can be combined with any differential volumes of either or both of Example 2 and 3. Additionally, any differential volumes of Example 2 can be combined with any differential volumes of either or both of Example 1 and 3. Additionally, any differential volumes of Example 3 can be combined with any differential volumes of either or both of Example 1 and 2.

TABLE 2

Frequency Ranges vs Differential Volumes (dB)

| | 20-49 Hz | 50-99 Hz | 100-199 Hz | 200-399 Hz | 400-999 Hz | 1000-1999 Hz | 2-3.99 kHz | 4.00-7.99 kHz | 8.00-15.99 kHz | 16.00-21 kHz |
|---|---|---|---|---|---|---|---|---|---|---|
| Example 1 | about 2 | about 1 | about 3 | about 1 | about 1 | about 3 | about 8 | about 11 | about 15 | about 16 |
| Example 2 | about 4 | about 4 | about 4 | about 4 | about 4 | about 5 | about 10 | about 14 | about 18 | about 21 |
| Example 3 | about 5 | about 5 | about 5 | about 5 | about 5 | about 7 | about 12 | about 16 | about 20 | about 25 |

Finally, in act 146*f*, the audio system is reconfigured to compensate for sound loss through the selected upholstery fabric by adjusting the actual volume of each of the one or more target frequencies or frequency bands emitted by the speaker and adjustable by the audio system by the corresponding calculated differential volume. As illustrated in Table 2, some embodiments include adjustments to higher frequencies (e.g., frequencies around 1 kHz or higher) that are greater in magnitude than adjustments made to lower frequencies. The exact magnitude of adjustment to each target frequency or frequency range depends on the magnitude of volume that is attenuated (i.e., reduced) by the particular fabric covering the speaker.

Method 146 may also include creation of a tuning profile corresponding to the selected upholstery fabric, such that the tuning profile may be implemented to tune any speaker covered by a fabric identical or similar to the selected upholstery fabric to compensate for sound loss through the upholstery fabric. The tuning profile created may include a fabric identifier and the calculated differential volume of each of the one or more target frequencies or frequency bands as obtained by methods of the present disclosure. Alternatively, the tuning profile may include a fabric identifier and ratios of the differential volume and the baseline volume to allow for linear adjustment of equalization as the overall volume level of the speaker is altered by a user. Also, differential volumes and/or ratios may be calculated at varying levels of overall volume by repeating method 146 for each of the various levels of overall volume, thus creating a stepwise volume adjustment profile. The calculated differential volumes or volume ratios of a tuning profile can thus be used to tune a speaker or speaker system by adjusting the actual volume of the one or more frequencies for which a calculated differential volume is provided.

Additional tuning profiles can also be created using methods of the present disclosure, each tuning profile corresponding to an additional upholstery fabric. For instance, during act 146*c* of method 146, the selected upholstery fabric may be replaced with each additional upholstery fabric in turn, then the remaining acts carried out for each additional upholstery fabric to create a corresponding tuning profile.

Accordingly, a speaker mounted within a furniture assembly can be tuned according to any of the tuning profiles, such as tuning profiles 140, 140*a*, 140*b* (FIGS. 4A-4C) created by selecting the tuning profile corresponding to the particular upholstery fabric covering the mounted speaker, those tuning profiles 140, 140*a*, 140*b*, being stored in a storage 142, 142*a*, 142*b* as illustrated in FIGS. 4A-4C. Application of the tuning profile can be achieved, for example, via a speaker controller 136 configured to control one or more speakers of the furniture assembly or by adjusting the output of an audio source 134. The speaker controller can include any known means for tuning the audio output of a speaker or system of speakers, such as but not limited to a center console associated with the speaker system, individual pre-amps associated with each speaker, a programmable audio output source, and so forth.

Figure 6:
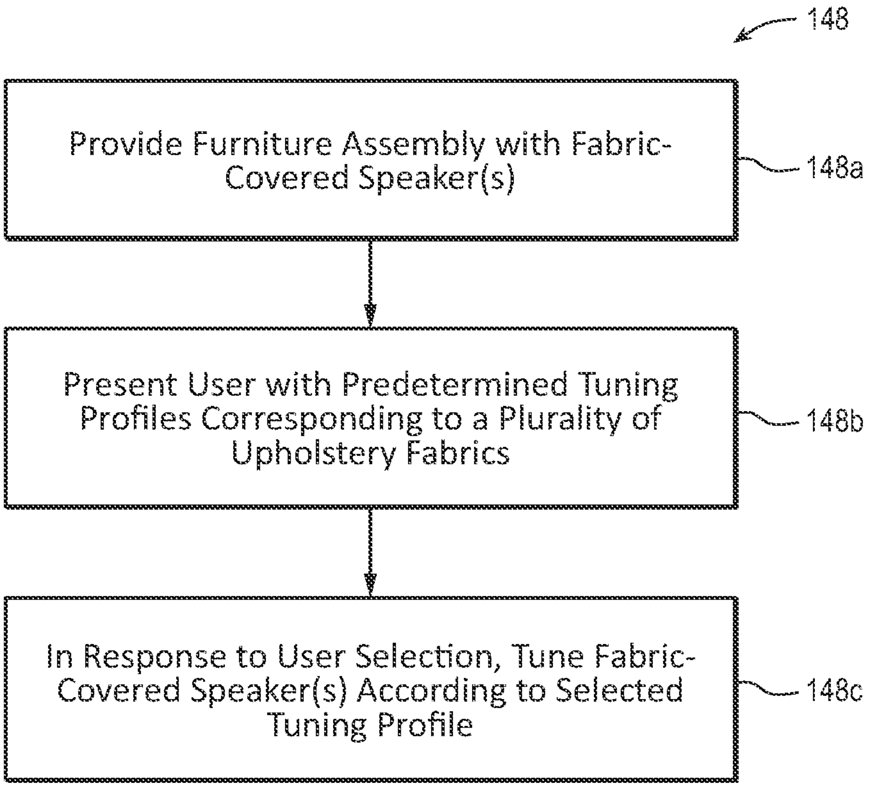
FIG. 6 illustrates a flowchart of a method of the present invention for tuning an audio-enhanced modular furniture system to compensate for sound loss through fabric.

FIG. 6 illustrates a flowchart of a method 148 for incorporating tuning profiles, such as those obtained by method 146, to tune an audio-enhanced modular furniture system, such as but not limited to those illustrated in FIGS. 1-3D, to compensate for sound loss through fabric. Such a method may be performed, e.g., by an end user, by the manufacturer, or other furniture provider. Act 148*a* of method 148 includes providing an assemble-able modular furniture assembly with at least one fabric-covered speaker controlled by a speaker controller, such as but not limited to a dedicated console or amplifier, a pre-amp or other controller individually dedicated to the at least one fabric-covered speaker, or an audio source configured to control the frequency response of the at least one fabric-covered speaker.

The assemble-able modular furniture assembly, for example, can include one or more bases, a plurality of upright members configured to attach to the one or more bases, and a speaker system, wherein at least one of upright members is an audio-enhanced upright member, such as the modular furniture assemblies illustrated in FIGS. 1-3D. The speaker system can include at least one speaker mounted within the first audio-enhanced upright member, the at least one speaker being hidden from view by a first upholstery fabric that covers the first audio-enhanced upright member.

According to act 148*b*, a plurality of predetermined tuning profiles is presented, each corresponding to an upholstery fabric and each operable by the speaker controller to adjust a volume of one or more target frequencies or frequency bands emitted by the at least one fabric-covered speaker to compensate for sound being emitted from the at least one speaker through the upholstery fabric.

In response to selection of a tuning profile, act 148*c* includes tuning the at least one fabric-covered speaker via the speaker controller to adjust an actual volume of one or more target frequencies or frequency bands by a magnitude approximately equal to a calculated differential volume included in the selected tuning profile. The calculated differential volume of each of the one or more audio frequencies is equal to the difference between: (i) a baseline volume corresponding to sound emitted from the at least one speaker or a similar speaker, and (ii) a resultant volume corresponding to sound emitted from the at least one speaker or similar speaker when covered with the first upholstery fabric or a similar fabric. Tuning of the at least one speaker can be accomplished by any known means of adjusting the equalization of audio frequencies of a speaker or speaker system, such as but not limited to the means discussed in connection with FIGS. 4A-4C herein.

One skilled in the art should appreciate that the disclosed methods can be performed under various circumstances. For instance, tuning profiles can be predetermined for one or more selected fabrics during design or development of an audio system, such as an audio-enhanced furniture assembly. Also, the plurality of tuning profiles can be presented and selectable via a user interface on a mobile device, a remote-control device, or a dedicated console associated with the speaker system. Alternatively, the furniture assembly can be provided to the consumer with a tuning profile already selected based on the upholstery fabric selected by the user when ordering the furniture. In at least one embodiment, the disclosed methods can be applied to an existing speaker, audio system, or speaker system having speakers at least partially covered in fabric to improve the sound quality of the existing system. As discussed herein, a user may be provided with means, such as a microphone or software capable of operating a microphone of a mobile device, for measuring the actual volume emitted through the fabric covering one or more speakers to determine a resultant volume of one or more target frequencies, calculate a differential volume for each target frequency, and reconfigure the existing system to adjust the actual volume of each target frequency, or corresponding frequency band, as emitted by each speaker to compensate for sound loss through the fabric.

Additionally, some embodiments include an assemble-able modular furniture assembly with a plurality of speakers, each speaker being separately tunable by separate selection of one of the pluralities of tuning profiles. In some embodiments, a user can select a tuning profile from the plurality of tuning profiles via a dedicated console, a remote controller, or a user interface of a mobile device or computer system, for the speaker system as a whole or for each individual speaker, depending on the placement of fabrics relative to the speakers included with the assemble-able modular furniture assembly.

Referring now to FIG. 7, an illustrative table of audio frequency adjustments for acoustically correcting sound loss through fabric according to embodiments of the present invention is provided. The illustrated table may be created for any fabric using the methods described herein, such as method 146 discussed in connection with FIG. 5 herein. For example, any number of target audio frequencies F1-Fn can be selected for adjustment, e.g., those frequencies typically adjustable by an equalizer function of equalization systems currently available.

These frequencies F1-Fn can include, for example, 32 Hz, 63 Hz, 125 Hz, 250 Hz, 500 Hz, 1 kHz, 2 kHz, 4 kHz, 6 kHz, and 16 kHz. These frequencies F1-Fn can include, for example, any frequencies ranging from about 20 Hz to about 21 kHz, with one or more adjustable frequencies from 20 Hz to 49 Hz, with one or more adjustable frequencies from 50 Hz to 99 Hz, with one or more adjustable frequencies from 100 Hz to 199 Hz, with one or more frequencies from 200 Hz to 399 Hz, with one or more frequencies from 400 Hz to 399 Hz, with one or more frequencies from 1 kHz to 1.999 kHz, with one or more frequencies from 2 kHz to 3.999 kHz, with one or more frequencies from 4 kHz to 7.999 kHz, with one or more frequencies from 8 kHz to 15.999 kHz, and with one or more frequencies from 16 kHz to 21 kHz. Alternatively, one or more of the foregoing frequency ranges can be targeted for adjustment using, for example, a graphical equalizer or similar device. Also, one skilled in the art should appreciate that the total range of frequencies selected for adjustment is not limited to between 20 Hz and 21 kHz but can be expanded to include any lower or higher frequencies if so desired.

A baseline equalization of the selected audio frequencies F1-Fn can then be selected, the baseline equalization including actual desired volumes V1-Vn corresponding to the selected audio frequencies F1-Fn (e.g., a desired frequency response curve for the speaker). Embodiments may include virtually any baseline equalization that enables measurement of the volume of each target frequency or frequency band as the speaker emits sound through the fabric for which the speaker is to be tuned. In other words, the volume of each target frequency within the selected baseline equalization needs to be sufficiently high to enable the proceeding method steps to be performed accurately.

Once the baseline equalization frequencies F1-Fn and the actual desired volumes V1-Vn are determined, resultant volumes V1_fabric1-Vn_fabric1 corresponding to sound emitted from a speaker through a first fabric (fabric1) can be determined according to methods of the present disclosure, and corresponding differential volumes ÄV1-ÄVn can be calculated and stored as a tuning profile corresponding to the first fabric, such that the calculated differential volumes ÄV1-ÄVn may be used to adjust the equalization of a speaker (the speaker's frequency response) covered by the first fabric, or a fabric similar thereto, to compensate for sound loss through the fabric. The disclosed methods can be performed for any number of fabrics to create corresponding tuning profiles in this manner. The differential volumes ÄV1-ÄVn vary based upon the particular audio frequencies F1-Fn being tested. As an alternative to adjusting discrete target frequencies F1-Fn (e.g., by parametric equalization at each target frequency F1-Fn), the differential volumes ÄV1-ÄVn can be applied to frequency bands that respectively include target frequencies F1-Fn (e.g., by graphical equalization at each respective frequency band).

Adjustments to the equalization or frequency response of a speaker can alternatively be implemented as a ratio of the calculated differential volume and the respective baseline volume, such that the equalization adjustment depends on the volume level of the speaker as selected by a user.

For example, and as illustrated in Table 3, each audio frequency can be adjusted by a multiplication factor or ratio up to about 1.03, about 1.06, or about 1.07 for a target frequency of about 32 Hz or a frequency band of about 20 Hz to about 49 Hz; up to about 1.01, about 1.05, or about 1.06 for a target frequency of about 63 Hz or a frequency band of about 50 Hz to about 99 Hz; up to about 1.03, about 1.04, or about 1.05 for a target frequency of about 125 Hz or a frequency band of about 100 Hz to about 199 Hz; up to about 1.01, about 1.04, or about 1.05 for a target frequency of about 250 Hz or a frequency band of about 199 Hz to about 399 Hz; up to about 1.01, about 1.04, or about 1.06 for a target frequency of about 500 Hz or a frequency band of about 400 Hz to about 999 Hz; up to about 1.03, about 1.06, or about 1.08 for a target frequency of about 1 kHz or a frequency band of about 1 kHz to about 1.9 kHz; up to about 1.09, about 1.11, or about 1.13 for a target frequency of about 2 kHz or a frequency band of about 2 kHz to about 3.9 kHz; up to about 1.12, about 1.16, or about 1.18 for a target frequency of about 4 kHz or a frequency band of about 4 kHz to about 7.9 kHz; up to about 1.17, about 1.21, or about 1.23 for a target frequency of about 8 kHz or a frequency band of about 8 kHz to about 15.9 kHz; and up to about 1.19, about 1.25, or about 1.30 for a target frequency of about 16 kHz or a frequency band of about 16 kHz to about 21 kHz. It is to be understood that the foregoing volume adjustments include lower magnitude adjustments below the presented upper limit, such as, for example, multiplying the volume of each target frequency or frequency band expressed above by a factor from about 1 to the presented maximum multiplication factor. Also, the foregoing adjustments ratios are provided as examples and are not intended to limit the scope of the present disclosure.

For instance, while certain multiplication factors or ratios are provided in each of Examples 1-3, it will be understood that any multiplication factors or ratios from any examples can be combined together. For instance, any multiplication factor or ratio of Example 1 can be combined with any multiplication factor or ratio of either or both of Example 2 and 3. Additionally, any multiplication factor or ratio of Example 2 can be combined with any multiplication factor or ratio of either or both of Example 1 and 3. Additionally, any multiplication factor or ratio of Example 3 can be combined with any multiplication factor or ratio of either or both of Example 1 and 2.

TABLE 3

| Frequency Ranges vs Multiplication Factor or Ratio | | | | | | | | | | |
|---|---|---|---|---|---|---|---|---|---|---|
| | 20-49 Hz | 50-99 Hz | 100-199 Hz | 200-399 Hz | 400-999 Hz | 1000-1999 Hz | 2-3.99 kHz | 4.00-7.99 kHz | 8.00-15.99 kHz | 16.00-21 kHz |
| Example 1 | 1.03 | 1.01 | 1.03 | 1.01 | 1.01 | 1.03 | 1.09 | 1.12 | 1.17 | 1.19 |
| Example 2 | 1.06 | 1.05 | 1.04 | 1.04 | 1.04 | 1.06 | 1.11 | 1.16 | 1.21 | 1.25 |
| Example 3 | 1.07 | 1.06 | 1.05 | 1.05 | 1.06 | 1.08 | 1.13 | 1.18 | 1.23 | 1.30 |

audio frequency adjustments for acoustically correcting sound loss through a variety of exemplary upholstery fabrics. Specifically, FIGS. 8A-8H include target audio frequency adjustments corresponding to upholstery fabrics including polyester (FIG. 8A), chenille (FIG. 8B), tweed (FIG. 8C), linen (FIG. 8D), velvet (FIG. 8E), leather (FIG. 8F), polyester linen (FIG. 8G), and faux fur (FIG. H), respectively. More specifically, the "EQ compensation" values provided in each table can be implemented FIGS. 8A-8H show tables of target by adjusting the actual volume of each target frequency (or a frequency band that includes the target frequency) as it is emitted from a speaker covered in the upholstery fabric corresponding to the respective table or tuning profile. One skilled in the art should appreciate that the boosting of audio frequencies provided herein specifically correspond to exemplary fabric materials of a particular composition, density, thickness, or weight, and to the specific baseline equalization presented, and that audio frequencies corresponding to virtually any material and/or baseline equalization can be calculated by the methods and systems described herein.

As illustrated in FIG. 8A-8E, the "EQ compensation" values below about 1000 Hz can range from about 1 dB to about 5 dB, from about 1 dB to about 4 dB, from about 1 dB to about 3 dB, or from about 1 dB to about 2 dB for a baseline equalization from about 70 dB to about 100 dB. More generally, the EQ compensation" values can be from about 1 dB to about 8 dB, from about 1 dB to about 7 dB, from about 1 dB to about 6 dB, from about 1 dB to about 5 dB, from about 2 dB to about 7 dB, from about 2 dB to about 6 dB, from about 2 dB to about 5 dB, from about 2 dB to about 4 dB, or from about 2 dB to about 3 dB.

Alternatively, speaker tuning can be accomplished by multiplication of one or more audio frequencies by a predetermined ratio or multiplication factor. For instance, each audio frequency can be adjusted by a multiplication factor ranging between about 1 and about 1.235 for speakers covered by leather, between about 1 and about 1.115 for speakers covered by polyester, between about 1 and about 1.063 for speakers covered by chenille or velvet, and between about 1 and about 1.037 for speakers covered by tweed or linen. One skilled in the art should appreciate that the foregoing values are provided as an example and are specific to example materials having a particular composition, density, thickness, and weight. As disclosed herein, specific adjustment values are preferably calculated on an individual basis for each upholstery fabric intended to cover a speaker or speaker system to ensure optimal sound quality as the sound is emitted though the selected upholstery fabric.

Figure 9:
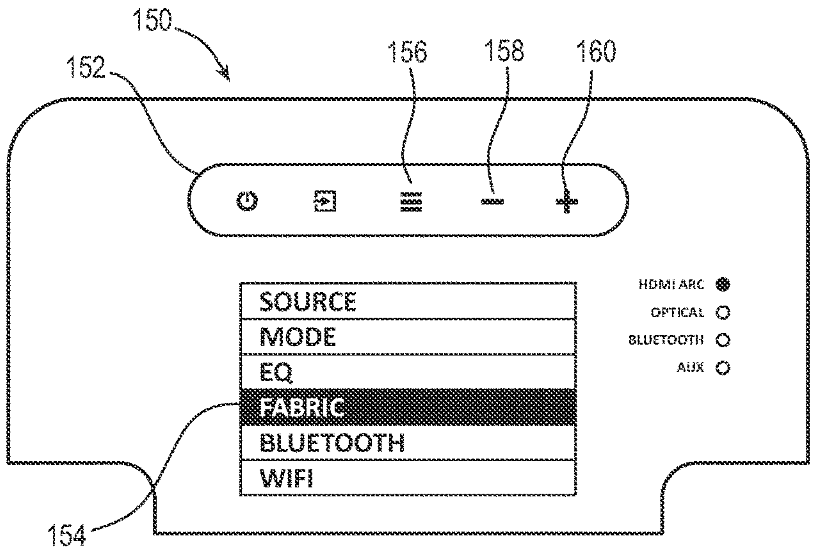
FIG. 9 illustrates a planar view of a control console of the present invention.

Referring now to FIG. 9, embodiments can include a control console dedicated to a speaker system and configured to enable a user to select a tuning profile from a plurality of tuning profiles, according to the present disclosure. The control console can be one configuration of the user input device 144, the audio source 134 and/or the computer system 135 of FIGS. 4A-4C. As illustrated, control console 150 includes a series of buttons 152 and a display 154, thus providing a user with means for selecting a tuning profile stored within a storage unit of the audio system and implemented by a tuning module, as illustrated in any of FIGS. 4A-4C. For example, a user can select menu button 156 and use navigation buttons 158 and 160 to select a tuning profile corresponding to any fabric for which a tuning profile is provided.

While display 154 can be configured as a liquid crystal display (LCD), alternative displays can be implemented, such as but not limited to a series of light-emitting diodes (LED) corresponding to each available tuning profile. Alternatively, the user can be provided with instructions for selecting, deselecting, and/or changing the tuning profile via a series of button selections, thus foregoing the need for an LCD or other display on control console 150.

Figure 10:
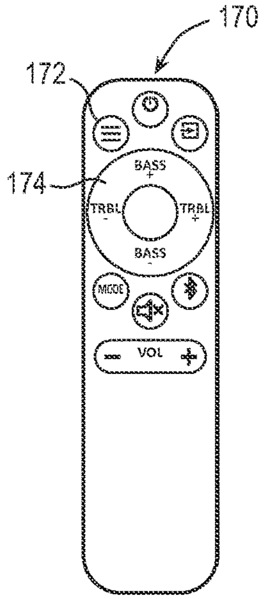
FIG. 10 illustrates a planar view of a remote control device of the present invention.

FIG. 10 illustrates an embodiment of a remote control device 170. The remote control device 170 can be one configuration of the user input device 144 or audio source 134 of FIGS. 4A-4C. Remote control device 170 can be operable to interact with a controller of an audio system using menu button 172 and navigation buttons 174. For example, remote control device 170 can be operable to interact with control console 150 via a wire or wireless connection, to assist a user in selection of a tuning profile for the audio system, as well as adjustment of other system settings. As an alternative example, remote control device 170 can be operable to interact with an interface programmed to display on a television screen or other display via a computer system included within control console 150.

Figure 11A:
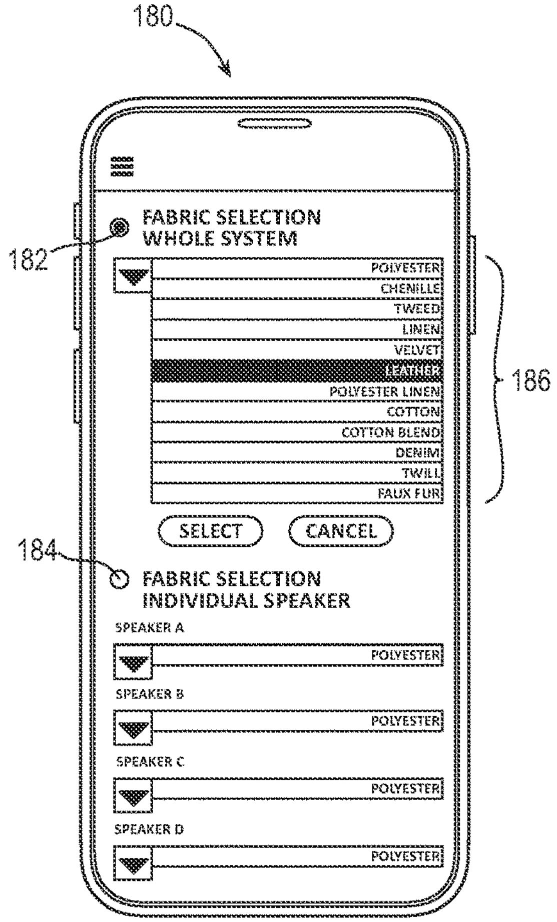
FIG. 11A illustrates a planar view of a mobile device displaying a user control interface of the present invention.
Figure 11B:
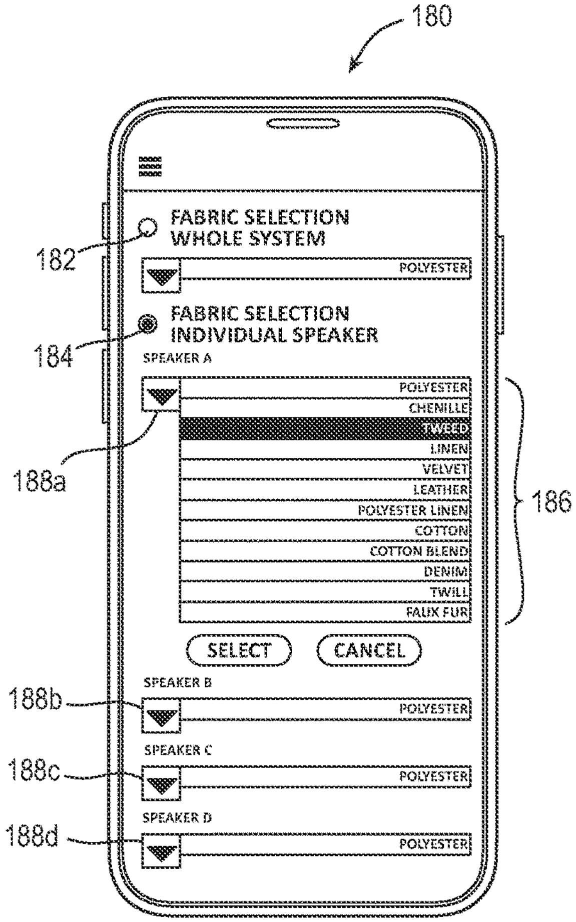
FIG. 11B illustrates a planar view of a mobile device displaying an additional feature of the user control interface of FIG. 11A.

FIGS. 11A-11B illustrate an exemplary mobile device 180 displaying an embodiment of a user control interface. The mobile device 180 can be one configuration of the user input device 144, the audio source 134, and/or the computer system 145 of FIGS. 4A-4C. Embodiments of a mobile device application can be operable to control various functions of the audio system, such as input/output, volume, user-adjustable equalization, and selection of tuning profiles based on upholstery fabric. Mobile device 180 can be configured to connect to a system controller via wireless communication directly with the controller, via a network connection, or via a wired connection. One skilled in the art should appreciate that the user interface is not limited to mobile devices but can be implemented on any system or device having a user interface, such as a computer console, a television, and so forth.

As illustrated, mobile device 180 has been programmed to display various selectable options to a user, including selection 182 of a tuning profile based on upholstery fabric for a whole speaker system, and selection 184 of a tuning profile based on upholstery fabric for each individual speaker 188*a-d* of a speaker system. Selection 184 thus allows for use of different upholstery fabrics on different components of the speaker system, such as by covering different audio-enhanced members (e.g., upright members and/or bases) of a modular furniture assembly with different fabric covers. An exemplary list 186 of selectable upholstery fabrics is shown, allowing the user to select a tuning profile corresponding to any upholstery fabric listed.

When a user makes selection 182 for tuning of the whole system, a single drop down list 186 of fabrics are displayed for user selection. If the user selects the fabric leather (as shown in FIG. 11A), for example, the mobile device will transmit a signal to a receiver, amplifier, or other appropriate component of the audio system to implement a tuning profile specifically configured to compensate for sound loss through a leather upholstery fabric. If instead the user makes selection 184 for tuning each individual speaker 188*a-d*, a drop down list 186 is made available for each of speakers 188*a-d*, such that the user may select any of the listed fabrics for each speaker 188*a-d*. For instance, if the user selects the fabric tweed for speaker 188*a* (as shown in FIG. 11B), the mobile device will transmit a signal to a receiver, amplifier, or other appropriate component of the audio system to implement a tuning profile specifically configured to compensate for sound loss through a tweed upholstery fabric for speaker 188*a* only.

Embodiments of a tuning profile can include the information used to adjust the equalization or frequency response of the speaker to which the tuning profile is applied to compensate for sound loss through the upholstery fabric to which the tuning profile corresponds. For example, each tuning profile can include a fabric name or identification number and a plurality of target frequency or frequency band adjustments, such as the "EQ Compensation" decibel values disclosed in FIGS. 8A-H. Alternatively, adjustments can be included in various forms, such as but not limited to ratio or multiplication factors. Also, tuning profiles can include adjustment values, ratios, or factors corresponding to a variety of baseline volume levels, such that the magnitude of adjustment is varied as the user adjusts the output volume of the audio system.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant work of furniture assemblies and audio systems.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

Following are some further example embodiments of the invention. These are presented only by way of example and are not intended to limit the scope of the invention in any way. Further, any example embodiment can be combined with one or more of the example embodiments.

Embodiment 1. An audio-enhanced furniture system, comprising: a furniture assembly; an upholstery fabric at least partially covering the furniture assembly; and a speaker system positioned within the furniture assembly, the speaker system comprising at least one speaker covered by the upholstery fabric, such that the at least one speaker is hidden from view, wherein the at least one speaker is configured to be tuned to compensate for sound being emitted from the speaker through the upholstery fabric by an adjustment to an equalization of one or more target audio frequencies emitted by the at least one speaker.

Embodiment 2. The audio-enhanced furniture system of embodiment 1, wherein the adjustment of the equalization of one or more target audio frequencies depends on at least one of a fabric type or a weight of the upholstery fabric.

Embodiment 3. The audio-enhanced furniture system of any of embodiments 1-2, further comprising a removable cover comprised of the upholstery fabric.

Embodiment 4. The audio-enhanced furniture system of any of embodiments 1-3, wherein the removeable cover is interchangeable with one or more alternative covers, each alternative cover comprising an alternative upholstery fabric.

Embodiment 5. The audio-enhanced furniture system of any of embodiments 1-4, wherein the at least one speaker is configured to be tuned via a mobile device.

Embodiment 6. The audio-enhanced furniture system of any of embodiments 1-5, wherein the at least one speaker is configured to be tuned via a control console associated with the furniture assembly.

Embodiment 7. The audio-enhanced furniture system of any of embodiments 1-6, further comprising at least one speaker controller in communication with the at least one speaker, the speaker controller being configured to control tuning of the at least one speaker.

Embodiment 8. The audio-enhanced furniture system of any of embodiments 1-7, wherein the at least one speaker controller is selectively controlled by at least one of a mobile device, a remote controller, or a console controller.

Embodiment 9. The audio-enhanced furniture system of any of embodiments 1-8, wherein the at least one speaker comprises a plurality of speakers, each speaker being configured to be tuned and controlled by the speaker controller.

Embodiment 10. The audio-enhanced furniture system of any of embodiments 1-9, wherein the one or more target audio frequencies comprises a plurality of target audio frequencies between about 20 Hz and 20 kHz.

Embodiment 11. The audio enhanced furniture system of any of embodiments 1-10, wherein at least one of the plurality of target audio frequencies is adjusted by at least 3 dB.

Embodiment 12. An audio-enhanced modular furniture system, comprising: (i) a modular furniture assembly comprising: (a) one or more bases; (b) a plurality of upright members, wherein at least two of the upright members are audio-enhanced upright members; and (ii) a speaker system positioned within the modular furniture assembly, the speaker system comprising: (a) at least one speaker mounted within a first audio-enhanced upright member, the at least one speaker being hidden from view by a first upholstery fabric that covers the first audio-enhanced upright member; (b) at least one speaker mounted within a second audio-enhanced upright member, the at least one speaker being hidden from view by a second upholstery fabric that covers the second audio-enhanced upright member; and (c) at least one speaker controller configured to control each speaker of the speaker system; wherein each speaker of the speaker system is configured to be tuned through the at least one speaker controller to compensate for sound being emitted from the speaker through the respective first or second upholstery fabric by adjusting one or more target audio frequencies emitted by the at least one speaker.

Embodiment 13. The audio-enhanced modular furniture assembly of embodiment 12, wherein the plurality of upright members can be selectively coupled to the one or more bases to form various furniture assembly configurations.

Embodiment 14. The audio-enhanced modular furniture system of any of embodiments 12-13, wherein at least one of the one or more bases is an audio-enhanced base, and wherein the speaker system further comprises at least one speaker mounted within the audio-enhanced base.

Embodiment 15. The audio-enhanced modular furniture system of any of embodiments 12-14, further comprising first and second removable covers, the first removable cover being comprised of the first upholstery fabric and the second removable cover being comprised of the second upholstery fabric.

Embodiment 16. The audio-enhanced modular furniture system of any of embodiments 12-15, wherein the adjustment of the equalization of one or more target audio frequencies depends on at least one of a fabric type or a weight of the upholstery fabric.

Embodiment 17. The audio-enhanced modular furniture system of any of embodiments 12-16, wherein the first upholstery fabric and the second upholstery fabric each comprise a different fabric type or weight, each speaker being tuned to specifically compensate for sound emitted through the corresponding first or second upholstery fabric.

Embodiment 18. The audio-enhanced furniture system of any of embodiments 12-17, wherein the fabric-specific tuning of each speaker is selectable via a dedicated control console, the control console selectively communicating with at least one speaker controller.

Embodiment 19. The audio-enhanced furniture system of any of embodiments 12-18, wherein the fabric-specific tuning of each speaker is selectable via a dedicated remote controller, the remote controller selectively communicating with at least one speaker controller.

Embodiment 20. The audio-enhanced furniture system of any of embodiments 12-19, wherein the fabric-specific tuning of each speaker is selectable via a mobile device, the mobile device selectively and wirelessly communicating with at least one speaker controller.

Embodiment 21. A method of tuning a speaker to compensate for loss of sound being emitted through upholstery fabric, the method comprising: providing an assemble-able modular furniture assembly comprising: (a) one or more bases; (b) a plurality of upright members, wherein at least one of the upright members is a first audio-enhanced upright member; and (c) a speaker system comprising: (i) at least one speaker mounted within the first audio-enhanced upright member, the at least one speaker being hidden from view by a first upholstery fabric that covers the first audio-enhanced upright member; and tuning the at least one speaker mounted within the first audio-enhanced upright member to compensate for sound being emitted from the at least one speaker through the first upholstery fabric by adjusting the equalization of one or more target audio frequencies emitted by the at least one speaker.

Embodiment 22. The method of embodiment 21, wherein the at least one speaker comprises a plurality of speakers, each speaker being separately tunable to compensate for sound being emitted from through fabric.

Embodiment 23. The method of any of embodiments 21-22, wherein tuning the at least one speaker comprises adjusting a signal transmitted from an audio source to the at least one speaker.

Embodiment 24. The method of any of embodiments 21-23, wherein tuning of the at least one speaker is provided through a software application on a mobile device.

Embodiment 25. The method of any of embodiments 21-24, wherein tuning of the at least one speaker is provided through a dedicated center console associated with the speaker system.

Embodiment 26. The method of any of embodiments 21-25, wherein the one or more target audio frequencies comprises a plurality of target audio frequencies between about 20 Hz and 20 kHz.

Embodiment 27. The method of any of embodiments 21-26, wherein at least one of the plurality of target audio frequencies is adjusted by at least 3 dB.

Embodiment 28. The method of any of embodiments 21-27, wherein each of the adjusted target audio frequencies is above 800 Hz.

Embodiment 29. The method of any of embodiments 21-28, wherein each of the adjusted target audio frequencies is above 2 kHz.

Embodiment 30. The method of any of embodiments 21-29, wherein each of the adjusted target audio frequencies is above 4 kHz.

Embodiment 31. An audio-enhanced furniture system, comprising: a furniture assembly; an upholstery fabric at least partially covering the furniture assembly; and a speaker system positioned within the furniture assembly, the speaker system comprising at least one speaker covered by the upholstery fabric, such that the at least one speaker is hidden from view, wherein the at least one speaker is configured to be tuned to compensate for sound being emitted from the speaker through the upholstery fabric by an adjustment to an equalization of one or more target audio frequencies or frequency bands emitted by the at least one speaker.

Embodiment 32. The audio-enhanced furniture system of embodiment 31, wherein the adjustment of the equalization of one or more target audio frequencies or frequency bands depends on at least one of a fabric type or a weight of the upholstery fabric.

Embodiment 33. The audio-enhanced furniture system of any of embodiments 31-32, further comprising a removable cover comprised of the upholstery fabric.

Embodiment 34. The audio-enhanced furniture system of any of embodiments 31-33, wherein the removeable cover is interchangeable with one or more alternative covers, each alternative cover comprising an alternative upholstery fabric.

Embodiment 35. The audio-enhanced furniture system of any of embodiments 31-34, wherein the at least one speaker is configured to be tuned by selection from a plurality of tuning profiles corresponding to a variety of upholstery fabrics.

Embodiment 36. The audio-enhanced furniture system of embodiment 35, wherein the plurality of tuning profiles includes tuning profiles corresponding to one or more of the following upholstery fabrics: polyester, chenille, tweed, linen, polyester linen, velvet, leather, cotton, cotton blend, denim, twill, or faux fur.

Embodiment 37. The audio-enhanced furniture system of any of embodiments 31-36, further comprising at least one speaker controller in communication with the at least one speaker, the speaker controller being configured to control tuning of the at least one speaker.

Embodiment 38. The audio-enhanced furniture system of any of embodiments 31-37, wherein the at least one speaker controller is selectively controlled by at least one of a mobile device, a remote controller, or a console controller.

Embodiment 39. The audio-enhanced furniture system of any of embodiments 31-38, wherein the at least one speaker comprises a plurality of speakers, each speaker being configured to be tuned and controlled by the speaker controller.

Embodiment 40. The audio-enhanced furniture system of any of embodiments 31-39, wherein the at least one speaker comprises a plurality of speakers, and wherein the at least one speaker controller comprises a plurality of dedicated speaker controllers, each dedicated speaker controller being dedicated to an individual speaker of the plurality of speakers.

Embodiment 41. An audio-enhanced modular furniture system, comprising: (i) a modular furniture assembly comprising: (a) one or more bases; (b) a plurality of upright members, wherein at least two of the upright members are audio-enhanced upright members; and (ii) a speaker system positioned within the modular furniture assembly, the speaker system comprising: (a) at least one speaker mounted within a first audio-enhanced upright member, the at least one speaker being hidden from view by a first upholstery fabric that covers the first audio-enhanced upright member; (b) at least one speaker mounted within a second audio-enhanced upright member, the at least one speaker being hidden from view by a second upholstery fabric that covers the second audio-enhanced upright member; and (c) at least one speaker controller configured to control each speaker of the speaker system; wherein each speaker of the speaker system is configured to be tuned through the at least one speaker controller to compensate for sound being emitted from the speaker through the respective first or second upholstery fabric by adjusting one or more target audio frequencies or frequency bands emitted by the at least one speaker.

Embodiment 42. The audio-enhanced modular furniture assembly of embodiment 41, wherein the plurality of upright members can be selectively coupled to the one or more bases to form various furniture assembly configurations.

Embodiment 43. The audio-enhanced modular furniture system of any of embodiments 41-42, further comprising first and second removable covers, the first removable cover being comprised of the first upholstery fabric and the second removable cover being comprised of the second upholstery fabric.

Embodiment 44. The audio-enhanced modular furniture system of any of embodiments 41-43, wherein at least one of the one or more bases is an audio-enhanced base, and wherein the speaker system further comprises at least one speaker mounted within the audio-enhanced base.

Embodiment 45. The audio-enhanced modular furniture system of any of embodiments 41-44, wherein each speaker of the speaker system is configured to be tuned according to a tuning profile comprised of at least one adjustment to at least one target audio frequency or frequency band emitted by the speaker, wherein the at least one adjustment depends on one or more characteristics of the respective first or second upholstery fabric through which the speaker emits sound.

Embodiment 46. The audio-enhanced modular furniture system of any of embodiments 41-45, wherein the tuning profile of each speaker of the speaker system is selectable from a plurality of tuning profiles corresponding to a variety of upholstery fabrics.

Embodiment 47. The audio-enhanced modular furniture system of any of embodiments 41-46, wherein the tuning profile of each speaker is selectable via a user interface on a mobile device, the mobile device selectively communicating with the at least one speaker controller.

Embodiment 48. The audio-enhanced modular furniture system of any of embodiments 41-47, wherein the tuning profile of each speaker is selectable via a dedicated control console, the control console selectively communicating with at least one speaker controller.

Embodiment 49. The audio-enhanced modular furniture system of any of embodiments 41-48, wherein the tuning profile of each speaker is selectable via a dedicated remote controller, the remote controller selectively communicating with at least one speaker controller.

Embodiment 50. The audio-enhanced modular furniture system of any of embodiments 41-49, wherein the at least one speaker controller comprises a plurality of dedicated speaker controllers, each dedicated speaker controller dedicated to an individual speaker of the speaker system.

Embodiment 51. The audio-enhanced modular furniture system of any of embodiments 41-50, wherein the tuning profile of each speaker is separately selectable via a user interface on a mobile device, the mobile device selectively communicating with the dedicated speaker controller of each speaker.

Embodiment 52. The audio-enhanced modular furniture system of any of embodiments 41-51, wherein the tuning profile of each speaker is selectable via a dedicated control console, the control console selectively communicating with the dedicated speaker controller of each speaker.

Embodiment 53. The audio-enhanced modular furniture system of any of embodiments 41-52, wherein the tuning profile of each speaker is selectable via a dedicated remote controller, the remote controller selectively communicating with the dedicated speaker controller of each speaker.

Embodiment 54. A method of tuning a speaker to compensate for sound being emitted through upholstery fabric, the method comprising: selecting a baseline equalization for a speaker within an audio system, the baseline equalization comprising one or more target audio frequencies, each audio frequency having a selected baseline volume; configuring the audio system such that the speaker emits sound at an actual volume approximately equal to the selected baseline volume of each of the one or more target audio frequencies; covering the speaker with a selected upholstery fabric; measuring a resultant volume of each of the one or more target audio frequencies as the speaker emits sound through the selected upholstery fabric; calculating a differential volume defined by the difference between the resultant volume and the selected baseline volume of each of the one or more target audio frequencies; and reconfiguring the audio system such that the speaker emits sound through the selected upholstery fabric according to the selected baseline equalization by adjusting the actual volume of each of the one or more target audio frequencies by a magnitude approximately equal to the differential volume of each respective target audio frequency.

Embodiment 55. The method of embodiment 54, further comprising: creating a tuning profile corresponding to the selected upholstery fabric, the tuning profile including each differential volume calculated for each of the one or more target audio frequencies.

Embodiment 56. The method of any of embodiments 54-55, further comprising: creating at least one additional tuning profile corresponding to at least one additional upholstery fabric by repeating each step of the recited method with the selected upholstery fabric being replaced by the at least one additional upholstery fabric.

Embodiment 57. The method of any of embodiments 54-56, further comprising: tuning a furniture-integrated speaker according to the tuning profile, wherein the furniture-integrated speaker is mounted within a furniture assembly and covered by an upholstery fabric that is identical or substantially similar to the selected upholstery fabric.

Embodiment 58. The method of any of embodiments 54-57, further comprising at least one speaker controller configured to control the at least one speaker, wherein reconfiguring the audio system further comprises tuning the speaker through at least one speaker controller associated with a modular furniture assembly.

Embodiment 59. The method of any of embodiments 54-58, wherein the at least one speaker controller comprises a dedicated center console configured to control the audio system.

Embodiment 60. The method of any of embodiments 54-59, further comprising: uploading the tuning profile to an audio source, such that the audio output signal of the audio source to a speaker system connected thereto is adjusted according to the tuning profile.

Embodiment 61. A method of tuning a speaker to compensate for loss of sound being emitted through upholstery fabric, the method comprising: providing an assemble-able modular furniture assembly comprising: (a) one or more bases; (b) a plurality of upright members, wherein at least one of the upright members is a first audio-enhanced upright member; and (c) a speaker system comprising: (i) at least one speaker mounted within the first audio-enhanced upright member, the at least one speaker being hidden from view by a first upholstery fabric that covers the first audio-enhanced upright member; and tuning the at least one speaker mounted within the first audio-enhanced upright member to compensate for sound being emitted from the at least one speaker through the first upholstery fabric by adjusting the equalization of one or more target audio frequencies or frequency bands emitted by the at least one speaker.

Embodiment 62. The method of embodiment 61, wherein tuning the at least one speaker comprises reconfiguring an audio system associated with the at least one speaker to adjust an actual volume of each of the one or more target audio frequencies or frequency bands by a magnitude approximately equal to a calculated differential volume of each of the one or more audio target frequencies or frequency bands.

Embodiment 63. The method of embodiment 62, wherein the calculated differential volume of each of the one or more target audio frequencies or frequency bands is equal to the difference between: (i) a baseline volume corresponding to sound emitted from the at least one speaker or a similar speaker, and (ii) a resultant volume corresponding to sound emitted from the at least one speaker or similar speaker when covered with the first upholstery fabric or a similar fabric.

Embodiment 64. The method of any of embodiments 54-63, further comprising: presenting a user with a plurality of tuning profiles corresponding to a plurality of upholstery fabrics; and in response to selection of one of the plurality of tuning profiles by the user, tuning the at least one speaker to compensate for sound being emitted from the speaker through the upholstery fabric to which the selected tuning profile corresponds.

Embodiment 65. The method of any of embodiments 54-64, wherein the at least one speaker comprises a plurality of speakers, each speaker being separately tunable by separate selection of one of the plurality of tuning profiles.

Embodiment 66. The method of any of embodiments 54-65, wherein the plurality of tuning profiles is presented and selectable via a user interface on a mobile device.

Embodiment 67. The method of any of embodiments 54-66, wherein the plurality of tuning profiles is presented and selectable via a dedicated console associated with the speaker system.

Embodiment 68. The method of any of embodiments 54-67, wherein tuning the at least one speaker comprises adjusting a signal transmitted from an audio source to the at least one speaker.

Embodiment 69. The method of any of embodiments 54-68, further comprising at least one speaker controller directly associated with the at least one speaker, the at least one speaker controller configured to tune the at least one speaker independent of signals transmitted to the speaker by an audio source.

Embodiment 70. The method of any of embodiments 54-69, wherein the one or more target audio frequencies or frequency bands are adjusted by increasing an actual volume of each of the one or more target audio frequencies or frequency bands by a magnitude up to about 25 decibels.

Embodiment 71. The method of any of embodiments 54-70, wherein each of the one or more target audio frequencies or frequency bands are adjusted by a magnitude between about 1 decibel and about 25 decibels.

Embodiment 72. The method of any of embodiments 54-71, wherein the one or more target audio frequencies or frequency bands are adjusted by increasing an actual volume of each of the one or more target audio frequencies or frequency bands by a magnitude up to about 21 decibels.

Embodiment 73. The method of any of embodiments 54-72, wherein each of the one or more target audio frequencies or frequency bands are adjusted by a magnitude between about 1 decibel and about 21 decibels.

Embodiment 74. The method of any of embodiments 54-73, wherein the one or more target audio frequencies or frequency bands are adjusted by increasing an actual volume of each of the one or more target audio frequencies or frequency bands by a magnitude up to about 16 decibels.

Embodiment 75. The method of any of embodiments 54-74, wherein each of the one or more target audio frequencies or frequency bands are adjusted by a magnitude between about 1 decibel and about 16 decibels.

Embodiment 76. The method of any of embodiments 54-75, wherein at least one of the one or more target audio frequencies or frequency bands is below 1000 Hz and is adjusted by a magnitude between about 1 decibel and about 8 decibels.

Embodiment 77. The method of any of embodiments 54-76, wherein the at least one target audio frequency or frequency band below 1000 Hz is adjusted by a magnitude between about 1 decibel and about 7 decibels.

Embodiment 78. The method of any of embodiments 54-77, wherein the at least one target audio frequency of frequency band below 1000 Hz is adjusted by a magnitude between about 1 decibel and about 6 decibels.

Embodiment 79. The method of any of embodiments 54-78, wherein the at least one target audio frequency of frequency band below 1000 Hz is adjusted by a magnitude between about 1 decibel and about 5 decibels.

Embodiment 80. The method of any of embodiments 54-79, wherein the at least one target audio frequency of frequency band below 1000 Hz is adjusted by a magnitude between about 1 decibel and about 4 decibels.

Embodiment 81. The method of any of embodiments 54-80, wherein the at least one target audio frequency of frequency band below 1000 Hz is adjusted by a magnitude between about 1 decibel and about 3 decibels.

Embodiment 82. The method of any of embodiments 54-81, wherein the at least one target audio frequency of frequency band below 1000 Hz is adjusted by a magnitude between about 1 decibel and about 2 decibels.

Embodiment 83. The method of any of embodiments 54-82, wherein the one or more target audio frequencies or frequency bands are adjusted by multiplying an actual volume of each of the one or more target audio frequencies or frequency bands by a factor from about 1 to about 1.3.

Embodiment 84. The method of any of embodiments 54-83, wherein the one or more target audio frequencies or frequency bands are adjusted by multiplying an actual volume of each of the one or more target audio frequencies or frequency bands by a factor from about 1 to about 1.25.

Embodiment 85. The method of any of embodiments 54-84, wherein the one or more target audio frequencies or frequency bands are adjusted by multiplying an actual volume of each of the one or more target audio frequencies or frequency bands by a factor from about 1 to about 1.2.

Embodiment 86. The method of any of embodiments 54-85, wherein the one or more target frequencies or frequency bands comprises at least four target frequencies or frequency bands.

Embodiment 87. The method of any of embodiments 54-86, wherein two or more of the at least four target frequencies or frequency bands are below 1000 Hz and are each adjusted by increasing an actual volume thereof by a magnitude from about 1 decibel to about 8 decibels.

Embodiment 88. The method of any of embodiments 54-87, wherein two or more of the at least four target frequencies or frequency bands are above 1000 Hz and are each adjusted by increasing an actual volume thereof by a magnitude from about 1 decibel to about 25 decibels.

Embodiment 89. The method of any of embodiments 54-88, wherein a magnitude of the adjustment of the equalization of one or more target audio frequencies or frequency bands depends on a selected volume of the speaker system.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method of tuning a speaker to compensate for loss of sound being emitted through upholstery fabric, the method comprising:

providing an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and tuning the at least one speaker mounted within the first audio-enhanced upright member to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein tuning the at least one speaker comprises reconfiguring an audio system associated with the at least one speaker to adjust an actual volume of each of the one or more target audio frequencies or frequency bands by a magnitude approximately equal to a calculated differential volume of each of the one or more audio target frequencies or frequency bands;

wherein the calculated differential volume of each of the one or more target audio frequencies or frequency bands is equal to the difference between: (i) a baseline volume corresponding to sound emitted from the at least one speaker or a similar speaker, and (ii) a resultant volume corresponding to sound emitted from the at least one speaker or similar speaker when covered with the first upholstery fabric or a similar fabric.

2. A method of tuning a speaker to compensate for loss of sound being emitted through upholstery fabric, the method comprising:

providing an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and tuning the at least one speaker mounted within the first audio-enhanced upright member to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

the method further comprising presenting a user with a plurality of tuning profiles corresponding to a plurality of upholstery fabrics; and in response to selection of one of the plurality of tuning profiles by the user, tuning the at least one speaker to compensate for sound being emitted from the speaker through the upholstery fabric to which the selected tuning profile corresponds.

3. The method of claim 2, wherein the at least one speaker comprises a plurality of speakers, each speaker being separately tunable by separate selection of one of the plurality of tuning profiles.

4. The method of claim 1, wherein each of the one or more target audio frequencies or frequency bands are adjusted by a magnitude between about 1 decibel and about 25 decibels.

5. The method of claim 1, wherein the one or more target audio frequencies or frequency bands are adjusted by increasing an actual volume of each of the one or more target audio frequencies or frequency bands by a magnitude up to about 21 decibels.

6. The method of claim 1, wherein each of the one or more target audio frequencies or frequency bands are adjusted by a magnitude between about 1 decibel and about 21 decibels.

7. The method of claim 1, wherein the one or more target audio frequencies or frequency bands are adjusted by increasing an actual volume of each of the one or more target audio frequencies or frequency bands by a magnitude up to about 16 decibels.

8. The method of claim 1, wherein each of the one or more target audio frequencies or frequency bands are adjusted by a magnitude between about 1 decibel and about 16 decibels.

9. The method of claim 1, wherein at least one of the one or more target audio frequencies or frequency bands is below 1000 Hz and is adjusted by a magnitude between about 1 decibel and about 8 decibels.

10. The method of claim 1, wherein the at least one target audio frequency or frequency band below 1000 Hz is adjusted by a magnitude between about 1 decibel and about 7 decibels.

11. The method of claim 1, wherein the at least one target audio frequency of frequency band below 1000 Hz is adjusted by a magnitude between about 1 decibel and about 6 decibels.

12. The method of claim 1, wherein the at least one target audio frequency of frequency band below 1000 Hz is adjusted by a magnitude between about 1 decibel and about 5 decibels.

13. The method of claim 1, wherein the at least one target audio frequency of frequency band below 1000 Hz is adjusted by a magnitude between about 1 decibel and about 4 decibels.

14. The method of claim 1, wherein the at least one target audio frequency of frequency band below 1000 Hz is adjusted by a magnitude between about 1 decibel and about 3 decibels.

15. The method of claim 1, wherein the at least one target audio frequency of frequency band below 1000 Hz is adjusted by a magnitude between about 1 decibel and about 2 decibels.

16. A method of tuning a speaker to compensate for loss of sound being emitted through upholstery fabric, the method comprising:

providing an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and tuning the at least one speaker mounted within the first audio-enhanced upright member to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the one or more target audio frequencies or frequency bands are adjusted by multiplying an actual volume of each of the one or more target audio frequencies or frequency bands by a factor from about 1 to about 1.3.

17. The method of claim 16, wherein the one or more target audio frequencies or frequency bands are adjusted by multiplying an actual volume of each of the one or more target audio frequencies or frequency bands by a factor from about 1 to about 1.25.

18. The method of claim 16, wherein the one or more target audio frequencies or frequency bands are adjusted by multiplying an actual volume of each of the one or more target audio frequencies or frequency bands by a factor from about 1 to about 1.2.

19. The method of claim 1, wherein the one or more target frequencies or frequency bands comprises at least four target frequencies or frequency bands.

20. A method of tuning a speaker to compensate for loss of sound being emitted through upholstery fabric, the method comprising:

providing an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and tuning the at least one speaker mounted within the first audio-enhanced upright member to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the one or more target frequencies or frequency bands comprises at least four target frequencies or frequency bands;

wherein two or more of the at least four target frequencies or frequency bands are below 1000 Hz and are each adjusted by increasing an actual volume thereof by a magnitude from about 1 decibel to about 8 decibels.

21. A method of tuning a speaker to compensate for loss of sound being emitted through upholstery fabric, the method comprising:

providing an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and tuning the at least one speaker mounted within the first audio-enhanced upright member to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the one or more target frequencies or frequency bands comprises at least four target frequencies or frequency bands;

wherein two or more of the at least four target frequencies or frequency bands are above 1000 Hz and are each adjusted by increasing an actual volume thereof by a magnitude from about 1 decibel to about 25 decibels.

22. The method of claim 1, wherein a magnitude of the adjustment of the equalization of one or more target audio frequencies or frequency bands depends on a selected volume of the speaker system.

23. A system configured for tuning a speaker to compensate for loss of sound being emitted through upholstery fabric, the system comprising:

an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and wherein the at least one speaker mounted within the first audio-enhanced upright member is tuned to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the at least one speaker is tuned by reconfiguring an audio system associated with the at least one speaker to adjust an actual volume of each of the one or more target audio frequencies or frequency bands by a magnitude approximately equal to a calculated differential volume of each of the one or more audio target frequencies or frequency bands;

wherein the calculated differential volume of each of the one or more target audio frequencies or frequency bands is equal to the difference between: (i) a baseline volume corresponding to sound emitted from the at least one speaker or a similar speaker, and (ii) a resultant volume corresponding to sound emitted from the at least one speaker or similar speaker when covered with the first upholstery fabric or a similar fabric.

24. A system configured for tuning a speaker to compensate for loss of sound being emitted through upholstery fabric, the system comprising:

an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and wherein the at least one speaker mounted within the first audio-enhanced upright member is tuned to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the speaker controller presents a user with a plurality of tuning profiles corresponding to a plurality of upholstery fabrics; and in response to selection of one of the plurality of tuning profiles by the user, the speaker controller tunes the at least one speaker to compensate for sound being emitted from the speaker through the upholstery fabric to which the selected tuning profile corresponds.

25. The system of claim 24, wherein the at least one speaker comprises a plurality of speakers, each speaker being separately tunable by separate selection of one of the plurality of tuning profiles.

26. The system of claim 23, wherein each of the one or more target audio frequencies or frequency bands are adjusted by a magnitude between about 1 decibel and about 25 decibels.

27. The system of claim 23, wherein the one or more target audio frequencies or frequency bands are adjusted by increasing an actual volume of each of the one or more target audio frequencies or frequency bands by a magnitude up to about 21 decibels.

28. The system of claim 23, wherein each of the one or more target audio frequencies or frequency bands are adjusted by a magnitude between about 1 decibel and about 21 decibels.

29. The system of claim 23, wherein the one or more target audio frequencies or frequency bands are adjusted by increasing an actual volume of each of the one or more target audio frequencies or frequency bands by a magnitude up to about 16 decibels.

30. The system of claim 23, wherein each of the one or more target audio frequencies or frequency bands are adjusted by a magnitude between about 1 decibel and about 16 decibels.

31. The system of claim 23, wherein at least one of the one or more target audio frequencies or frequency bands is below 1000 Hz and is adjusted by a magnitude between about 1 decibel and about 8 decibels.

32. The system of claim 23, wherein the at least one target audio frequency or frequency band below 1000 Hz is adjusted by a magnitude between about 1 decibel and about 7 decibels.

33. The system of claim 23, wherein the at least one target audio frequency of frequency band below 1000 Hz is adjusted by a magnitude between about 1 decibel and about 6 decibels.

34. The system of claim 23, wherein the at least one target audio frequency of frequency band below 1000 Hz is adjusted by a magnitude between about 1 decibel and about 5 decibels.

35. The system of claim 23, wherein the at least one target audio frequency of frequency band below 1000 Hz is adjusted by a magnitude between about 1 decibel and about 4 decibels.

36. The system of claim 23, wherein the at least one target audio frequency of frequency band below 1000 Hz is adjusted by a magnitude between about 1 decibel and about 3 decibels.

37. The system of claim 23, wherein the at least one target audio frequency of frequency band below 1000 Hz is adjusted by a magnitude between about 1 decibel and about 2 decibels.

38. A system configured for tuning a speaker to compensate for loss of sound being emitted through upholstery fabric, the system comprising:

an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and wherein the at least one speaker mounted within the first audio-enhanced upright member is tuned to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the one or more target audio frequencies or frequency bands are adjusted by multiplying an actual volume of each of the one or more target audio frequencies or frequency bands by a factor from about 1 to about 1.3.

39. The system of claim 38, wherein the one or more target audio frequencies or frequency bands are adjusted by multiplying an actual volume of each of the one or more target audio frequencies or frequency bands by a factor from about 1 to about 1.25.

40. The system of claim 38, wherein the one or more target audio frequencies or frequency bands are adjusted by multiplying an actual volume of each of the one or more target audio frequencies or frequency bands by a factor from about 1 to about 1.2.

41. The system of claim 23, wherein the one or more target frequencies or frequency bands comprises at least four target frequencies or frequency bands.

42. A system configured for tuning a speaker to compensate for loss of sound being emitted through upholstery fabric, the system comprising:

an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and wherein the at least one speaker mounted within the first audio-enhanced upright member is tuned to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the one or more target frequencies or frequency bands comprises at least four target frequencies or frequency bands;

wherein two or more of the at least four target frequencies or frequency bands are below 1000 Hz and are each adjusted by increasing an actual volume thereof by a magnitude from about 1 decibel to about 8 decibels.

43. A system configured for tuning a speaker to compensate for loss of sound being emitted through upholstery fabric, the system comprising:

an assemble-able modular furniture assembly comprising:

(a) one or more bases;

(b) a plurality of upright members, wherein at least one of the upright members is a first audio-enhanced upright member; and (c) a speaker system comprising:

(i) at least one speaker mounted within the first audio-enhanced upright member, the at least one speaker being hidden from view by a first upholstery fabric that covers the first audio-enhanced upright member;

wherein the furniture assembly further comprises at least one speaker controller directly associated with the at least one speaker, the at least one speaker controller configured to tune the at least one speaker independent of signals transmitted to the speaker by an audio source; and wherein the at least one speaker mounted within the first audio-enhanced upright member is tuned to compensate for sound being emitted from the at least one speaker through the first upholstery fabric by adjusting the equalization of one or more target audio frequencies or frequency bands emitted by the at least one speaker;

wherein the one or more target audio frequencies or frequency bands are adjusted by increasing an actual volume of each of the one or more target audio frequencies or frequency bands by a magnitude up to about 25 decibels;

wherein the one or more target frequencies or frequency bands comprises at least four target frequencies or frequency bands;

wherein two or more of the at least four target frequencies or frequency bands are above 1000 Hz and are each adjusted by increasing an actual volume thereof by a magnitude from about 1 decibel to about 25 decibels.

44. The system of claim 23, wherein a magnitude of the adjustment of the equalization of one or more target audio frequencies or frequency bands depends on a selected volume of the speaker system.

* * * * *